(12) United States Patent
Darrow et al.

(10) Patent No.: US 10,420,225 B2
(45) Date of Patent: Sep. 17, 2019

(54) TRANSPORT PATH CORRECTION TECHNIQUES AND RELATED SYSTEMS, METHODS AND DEVICES

(71) Applicant: Kateeva, Inc., Newark, CA (US)

(72) Inventors: David C. Darrow, Pleasanton, CA (US); Digby Pun, San Jose, CA (US); Robert B. Lowrance, San Jose, CA (US); Alexander Sou-Kang Ko, Santa Clara, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 15/816,443

(22) Filed: Nov. 17, 2017

(65) Prior Publication Data

US 2018/0228034 A1    Aug. 9, 2018

Related U.S. Application Data

(63) Continuation of application No. 15/642,037, filed on Jul. 5, 2017, now Pat. No. 9,961,782.
(Continued)

(51) Int. Cl.
*H05K 3/46* (2006.01)
*B05C 5/02* (2006.01)
(Continued)

(52) U.S. Cl.
CPC ......... *H05K 3/4644* (2013.01); *B05C 5/0208* (2013.01); *B05D 5/12* (2013.01);
(Continued)

(58) Field of Classification Search
None
See application file for complete search history.

(56) References Cited

U.S. PATENT DOCUMENTS

| | | |
|---|---|---|
| 4,069,697 A | 1/1978 | Morrison et al. |
| 4,283,929 A | 8/1981 | Heiberger |

(Continued)

FOREIGN PATENT DOCUMENTS

| | | |
|---|---|---|
| JP | 2005062819 A | 3/2005 |
| JP | 2006524435 A | 10/2006 |

(Continued)

OTHER PUBLICATIONS

Examiner Initiated Interview Summary dated Dec. 11, 2017, to U.S. Appl. No. 15/642,188.
(Continued)

*Primary Examiner* — Jethro M. Pence
(74) *Attorney, Agent, or Firm* — Paula J. Tostado

(57) ABSTRACT

A printer deposits material onto a substrate as part of a manufacturing process for an electronic product. At least one mechanical component experiences mechanical error, which is mitigated using transducers that equalize position of a transported thing, e.g., to provide an "ideal" conveyance path; a substrate conveyance system and/or a printhead conveyance system can each use transducers in this manner to improve precise droplet placement. In one embodiment, errors are measured in advance, with corrections being "played back" during production runs to mitigate repeatable transport path error. In a still more detailed embodiment, the transducers can be predicated on voice coils, which cooperate with a floatation table and floating, mechanical pivot assembly to provide frictionless, but mechanically-supported error correction.

11 Claims, 11 Drawing Sheets

Related U.S. Application Data

(60) Provisional application No. 62/489,768, filed on Apr. 25, 2017, provisional application No. 62/459,402, filed on Feb. 15, 2017, provisional application No. 62/359,969, filed on Jul. 8, 2016.

(51) Int. Cl.

| | | |
|---|---|---|
| *H01L 23/02* | (2006.01) | |
| *H01L 23/28* | (2006.01) | |
| *B05D 5/12* | (2006.01) | |
| *B41J 29/393* | (2006.01) | |
| *B41J 3/407* | (2006.01) | |
| *B41J 13/00* | (2006.01) | |
| *H01L 51/00* | (2006.01) | |
| *B41J 2/01* | (2006.01) | |
| *H01L 21/67* | (2006.01) | |
| *H01L 21/683* | (2006.01) | |
| *H01L 21/677* | (2006.01) | |
| *H01L 21/68* | (2006.01) | |

(52) U.S. Cl.
CPC ........... *B41J 3/407* (2013.01); *B41J 13/0027* (2013.01); *B41J 29/393* (2013.01); *H01L 51/00* (2013.01); *H05K 3/4679* (2013.01); *B41J 2/01* (2013.01); *H01L 21/67* (2013.01); *H01L 21/6715* (2013.01); *H01L 21/6776* (2013.01); *H01L 21/67784* (2013.01); *H01L 21/68* (2013.01); *H01L 21/683* (2013.01); *H01L 51/0005* (2013.01); *H05K 2203/013* (2013.01); *H05K 2203/0104* (2013.01); *H05K 2203/0736* (2013.01); *H05K 2203/166* (2013.01)

(56) References Cited

U.S. PATENT DOCUMENTS

| | | | |
|---|---|---|---|
| 4,295,741 A | 10/1981 | Palma et al. | |
| 4,303,978 A * | 12/1981 | Shaw | G01C 21/16 244/177 |
| 4,470,304 A | 9/1984 | Nusbickel, Jr. et al. | |
| 4,525,057 A * | 6/1985 | Kaufmann | G03G 15/2092 271/226 |
| 5,191,200 A | 3/1993 | Werf et al. | |
| 5,489,925 A | 2/1996 | Brooks et al. | |
| 5,894,342 A | 4/1999 | Halup et al. | |
| 5,933,573 A | 8/1999 | Lukenich et al. | |
| 7,604,439 B2 | 10/2009 | Yassour et al. | |
| 9,505,245 B2 | 11/2016 | Lowrance et al. | |
| 9,884,501 B2 | 2/2018 | Lowrance et al. | |
| 2002/0079057 A1 | 6/2002 | Yoshioka et al. | |
| 2003/0097929 A1 | 5/2003 | Watanabe et al. | |
| 2003/0175414 A1 | 9/2003 | Hayashi | |
| 2004/0003738 A1 | 1/2004 | Imiolek et al. | |
| 2004/0056244 A1 | 3/2004 | Marcus et al. | |
| 2004/0086631 A1 | 5/2004 | Han et al. | |
| 2004/0118309 A1 | 6/2004 | Fedor et al. | |
| 2004/0197179 A1 | 10/2004 | Achkire et al. | |
| 2005/0001579 A1 | 1/2005 | Touzov | |
| 2005/0031975 A1 | 2/2005 | Reuhman-Huisken et al. | |
| 2005/0040338 A1 | 2/2005 | Weiss et al. | |
| 2005/0045096 A1 | 3/2005 | Kojima | |
| 2006/0120833 A1 | 6/2006 | Bonora et al. | |
| 2006/0158470 A1 | 7/2006 | Vanheusden et al. | |
| 2006/0219605 A1 | 10/2006 | Devitt | |
| 2007/0031603 A1 | 2/2007 | Eron | |
| 2007/0257033 A1 | 11/2007 | Yamada | |
| 2010/0201749 A1 | 8/2010 | Somekh et al. | |
| 2011/0149000 A1 | 6/2011 | Albertalli et al. | |
| 2011/0318503 A1 | 12/2011 | Adams et al. | |
| 2012/0044292 A1 | 2/2012 | Helsel et al. | |
| 2013/0040061 A1 | 2/2013 | Lowrance et al. | |
| 2013/0252533 A1 | 9/2013 | Mauck et al. | |
| 2013/0284946 A1 | 10/2013 | Schaede | |
| 2013/0294877 A1 | 11/2013 | Hosek | |
| 2014/0023112 A1 | 1/2014 | Millar et al. | |
| 2014/0374375 A1 | 12/2014 | Zwiers et al. | |
| 2015/0314325 A1 | 11/2015 | Ko et al. | |
| 2015/0360462 A1 | 12/2015 | Lowrance et al. | |
| 2017/0129265 A1 | 5/2017 | Lowrance et al. | |
| 2018/0014410 A1 | 1/2018 | Darrow et al. | |
| 2018/0014411 A1 | 1/2018 | Vronsky et al. | |
| 2018/0160550 A1 | 6/2018 | Vronsky et al. | |
| 2018/0264862 A1 | 9/2018 | Lowrance et al. | |

FOREIGN PATENT DOCUMENTS

| | | |
|---|---|---|
| JP | 2007533153 A | 11/2007 |
| JP | 2010533057 A | 10/2010 |
| JP | 2014502220 A | 1/2014 |
| TW | I579538 B | 3/2004 |
| TW | 200420179 A | 10/2004 |
| TW | 200508140 A | 3/2005 |
| TW | 201238784 B | 4/2016 |
| WO | 2014084888 A1 | 6/2014 |

OTHER PUBLICATIONS

International Search Report and Written Opinion dated Apr. 24, 2018, to PCT Application No. PCT/US18/16929.
Notice of Allowance dated Nov. 27, 2017, to U.S. Appl. No. 15/642,188.
Supplemental Notice of Allowability dated Dec. 12, 2017 to U.S. Appl. No. 15/642,188.
Examiner Initiated Summary dated Nov. 16, 2017, to U.S. Appl. 15/642,037.
Informal Comments Submitted by Applicant in response to Written Opinion for International Patent Application No. PCT/US/2017/040968, 2 pages, filed Nov. 17, 2017.
Informal Comments Submitted by Applicant in response to Written Opinion for International Patent Application No. PCT/US2017/040970. 2 pages, filed Nov. 14, 2017.
International Search Report and Written Opinion dated Sep. 17, 2015 to PCT Application PCT/US2015/35700.
International Search Report and Written Opinion dated Sep. 22, 2017 for International Patent Application No. PCT/US/2017/040968.
International Search Report and Written Opinion dated Sep. 26, 2017 for International Patent Application No. PCT/US2017/040970.
Notice of Allowance dated Dec. 4, 2017, to U.S. Appl. No. 15/642,037.
Notice of Allowance dated Nov. 16, 2017, to U.S. Appl. No. 15/642,037.
XL-80 Laser System Training Course Manual (Part 1), Renishaw apply innovation, training manual, Dec. 2008; pp. 2.1-2.26.
Examination Report dated Feb. 26, 2018, to TW Patent Application No. 104119382.
Examination report dated Oct. 9, 2018, to TW Patent Application No. 10729318.
Extended EP Search Report dated Feb. 12, 2018, to EP Patent Application No. 15809195.9.
KR Provisional Rejection dated Aug. 14, 2018, to KR Patent Application No. 10-2017-7000812.
Non-Final Office action dated Dec. 5, 2018, to U.S. Appl. No. 15/828,335.
Notice of Allowance dated Oct. 9, 2018, to U.S. Appl. No. 15/836,617.
Notice of Allowance dated Feb. 21, 2019, to U.S. Appl. No. 15/836,617 (Available via USPTO PAIR System).
Notice of Allowance dated Mar. 25, 2019 to U.S. Appl. No. 15/828,335 (Available via USPTO PAIR System).

* cited by examiner

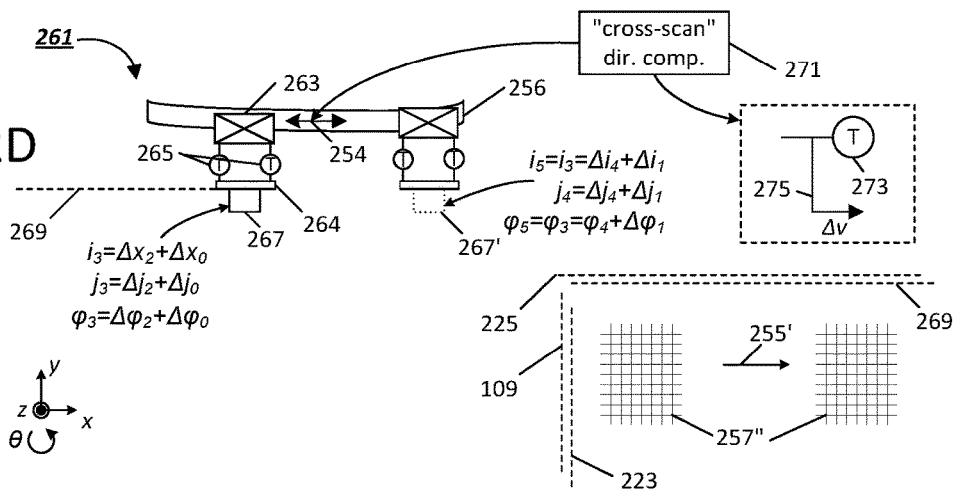
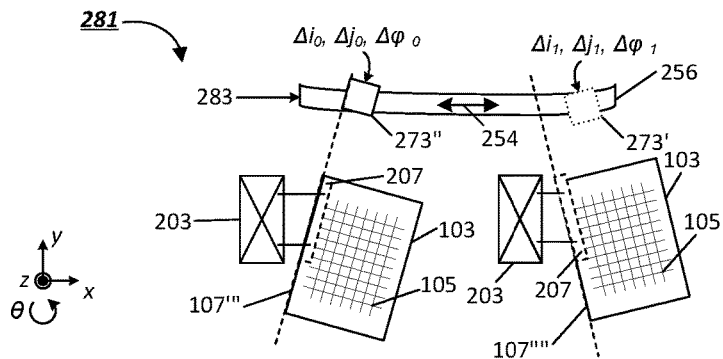
FIG. 2D
FIG. 2E

TRANSPORT PATH CORRECTION TECHNIQUES AND RELATED SYSTEMS, METHODS AND DEVICES

This disclosure claims the benefit of U.S. Utility patent application Ser. No. 15/642,037, filed on behalf of first-named inventor Digby Pun on Jul. 5, 2017, U.S. Provisional Application No. 62/489,768, filed on Apr. 25, 2017 on behalf of first-named inventor Digby Pun and U.S. Provisional Application No. 62/359,969, filed on Jul. 8, 2016 on behalf of first-named inventor Digby Pun, each titled "Transport Path Correction Techniques And Related Systems, Methods And Devices," and U.S. Provisional Patent Application No. 62/459,402, filed on Feb. 15, 2017 on behalf of first-named inventor David C. Darrow for "Precision Position Alignment, Calibration and Measurement in Printing And Manufacturing Systems;" each of these applications is hereby incorporated by reference. This disclosure also incorporates by reference the following documents: U.S. Pat. No. 9,352,561 (U.S. Ser. No. 14/340,403), filed as an application on Jul. 24, 2014 on behalf of first inventor Nahid Harjee for "Techniques for Print Ink Droplet Measurement And Control To Deposit Fluids Within Precise Tolerances;" US Patent Publication No. 20150360462 (U.S. Ser. No. 14/738,785), filed as an application on Jun. 12, 2015 on behalf of first inventor Robert B. Lowrance for "Printing System Assemblies and Methods;" US Patent Publication No. 20150298153 (U.S. Ser. No. 14/788,609), filed as an application on Jun. 30, 2015 on behalf of first-named inventor Michael Baker for "Techniques for Arrayed Printing of a Permanent Layer with Improved Speed and Accuracy;" and U.S. Pat. No. 8,995,022, filed as an application on Aug. 12, 2014 on behalf of first-named inventor Eliyahu Vronsky for "Ink-Based Layer Fabrication Using Halftoning To Control Thickness."

BACKGROUND

Certain types of industrial printers can be applied to precision manufacture, for example, to the fabrication of electronic devices.

To take one non-limiting example, ink jet printers can be used to deposit one or more super-thin layers of an electronic display device or a solar panel device. The "ink" in this case differs from conventional notions of ink as a dye of a desired color, and instead can be an organic monomer deposited as discrete droplets that spread somewhat and meld together, but that are not absorbed and instead retain a deliberate layer thickness that helps impart structural, electromagnetic or optical properties to the finished device; the ink is also typically deliberately made to be translucent with a resultant layer being used to generate and/or transmit light. A continuous coat of the ink deposited by the printing is then processed in place (e.g., cured using ultraviolet light, or otherwise baked or dried) to form a permanent layer having a very tightly regulated thickness, e.g., 1-10 microns, depending on application. These types of processes can be used to deposit hole injection layers ("HILs") of OLED pixels, hole transfer layers ("HTLs"), hole transport layers ("HTLs"), emissive or light emitting layers ("EMLs"), electron transport layers ("ETLs"), electron injecting layers ("EILs"), various conductors such as an anode or cathode layer, hole blocking layers, electron blocking layers, polarizers, barrier layers, primers, encapsulation layers and other types of layers. The referenced materials, processes and layers are exemplary only. In one application, the ink can be deposited to create a layer in each of many individual electronic components or structures, for example, within individual microscopic fluidic reservoirs (e.g., within "wells") to form individual display pixels or photovoltaic cell layers; in another application, the ink can be deposited to have macroscopic dimensions, for example, to form one or more encapsulation layers cover many such structures (e.g., spanning a display screen area having millions of pixels).

The required precision can be very fine; for example, a manufacturer's specification for fabricating a thin layer of an organic light emitting diode ("OLED") pixel might specify aggregate fluid deposition within a pixel well to a resolution of a picoliter (or to even a greater level of precision). Even slight local variations in the volume of deposited fluid from specification can give rise to problems. For example, variation in ink volume from structure-to-structure (e.g., pixel-to-pixel) can give rise to differences in hue or intensity differences or other performance discrepancies which are noticeable to the human eye; in an encapsulation or other "macroscopic" layers, such variation can compromise layer function (e.g., the layer may not reliably seal sensitive electronic components relative to unwanted particulate, oxygen or moisture), or it can otherwise give rise to observable discrepancies. As devices become smaller and smaller, and the pertinent layers become thinner and thinner, these problems become much more significant. When it is considered that a typical application can feature printers having tens-of-thousands of nozzles that deposit discrete droplets each having a volume of 1-30 picoliters ("pL"), and that manufacturing process corners for the printheads can lead to inoperative nozzles and individual error in any of droplet size, nozzle location, droplet velocity or droplet landing position, thereby giving rise to localized ink volume delivery variation, it should be appreciated that there are very great challenges in producing thin, homogeneous layers that closely track desired manufacturing specifications.

One source of error in achieving fine precision relates to the use of mechanical components in the fabrication processes relative to the scale of products being manufactured. As a non-limiting example, most printers have mechanical transport systems that move one or more printheads, a substrate, or both in order to perform printing. Some printers also feature transport systems for rotating or offsetting components (e.g., moving or rotating printheads to change effective pitch between nozzles); each of these transport systems can impart fine mechanical or positioning error that in turn can lead to non-uniformity. For example, even though these transport systems typically rely on high-precision parts (e.g., precision tracks or edge guides), they can still impart jitter or translational or rotational inaccuracy (e.g., such as millimeter, micron or smaller scale excursions in the transport path) that makes it difficult to achieve the required precision and uniformity throughout the transport path lengths used for manufacture. To provide context, an apparatus used to fabricate large size HDTV screens might feature a "room sized" printer which is controlled so as to deposit an ultra-thin material layer on substrates meters wide by meters long, with individual droplet delivery planned to nanometer-scale coordinates; the transport paths in such an apparatus can be meters in length. Note that there are many other mechanical components that can give rise to some form of error in such a system, for example, transport path systems used to interchange printheads, camera assemblies to align or inspect a substrate, and other types of moving parts. In such a system, even very fine precision mechanical parts can create excursions that affect the nanometer-scale coordinates just referenced. Thus, the required layers become thinner and thinner, and the require precision becomes smaller and smaller relative to the product being fabricated, it becomes even more imperative to carefully control and/or mitigate sources of potential positional error.

There exist some conventional techniques for reducing positional and translational error generally in these types of fabrication systems. First, a substrate can be coarsely-aligned with printer transport and then manually fine-aligned (potentially repeatedly during the fabrication process); such a process is time-consuming, i.e., it generally impedes the goal of having an automated, fast, assembly-line style process for producing consumer products. It is also generally quite difficult to obtain the required micron- or nanometer-precision with such a manual process. There also are some errors that cannot be adequately addressed with such a technique, for example, errors caused by transport path discrepancies, as just introduced above (e.g., error which manifests itself after a substrate has been aligned). As a second example, US Patent Publication No. 20150298153 relates to processes that measure fine positional and/or rotational errors in substrate position and that correct for those errors in software, for example, by reassigning which nozzles are used to print or by otherwise changing the nozzle drive waveforms which are used to fire nozzles; in other words, generally speaking, these techniques attempt to "live with" fine positional and rotational error (thereby preserving print speed) and they then attempt to adjust which nozzles are used and when and how those nozzles are electronically controlled, so as to remedy error (e.g., using a preplanned raster without having to re-adjust scan paths dependent on error). However, despite the utility of compensating for alignment error in software, the measuring and accounting for this error and re-computing firing assignments for thousands of nozzles in software can take substantial computing resources and time.

What are needed are additional techniques for correcting for motion, rotation and position error in mechanical systems in a manufacturing apparatus. Still further, what are needed are techniques for correcting for error in a moving component of a manufacturing system in order to simulate an "ideal" edge or transport path. Such techniques, if applied to precision manufacturing processes, especially printing systems of the type described, would reduce the need for substantial computing resources and time to re-render raster control data and, overall, lead to a simpler and/or faster and/or more accurate print process. The present invention addresses these needs and provides further, related advantages.

BRIEF DESCRIPTION OF THE FIGURES

FIG. 1 shows the substrate at two hypothetical positions (103' and 103") with respective rotation and translation error ($\Delta x$, $\Delta y$, and $\Delta \theta$). Transport path error and associated substrate rotation and translation error is seen as exaggerated relative to drawing scale, to assist with explanation.

FIG. 2D is similar to FIG. 2C in that it depicts motion of a printhead along an edge or track 256 but, as illustrated, a printhead assembly now also has its own transducer assembly(ies) to provide for fine tuning positional and rotational corrections that mitigate error in the edge or track 256; the result is that the printhead now also effectively travels a virtual "ideal" path 225 (or 269, as will be discussed below).

FIG. 2E represents an alternative embodiment where error in one transport path (e.g., the printhead transport path) can be mitigated by an error correction mechanism in a different transport path; for example, an error correction mechanism such as transducers "T" associated with the gripper 203 can perform fine adjustments to substrate position or orientation that compensate for error in a different transport path (e.g., such as the printhead transport path). Note that corrections can be dependent on multiple variables, e.g., they can be made to depend on time-variant motion along or position along the other transport path; for example, the transducers "T" can be controlled as the gripper 203 moves in the "y" dimension in a manner that is also dependent on printhead assembly position along track 256, such that the substrate follows virtual path 107''' or virtual path 107'''' (i.e., depending on both gripper position and printhead assembly position).

Figure 1:
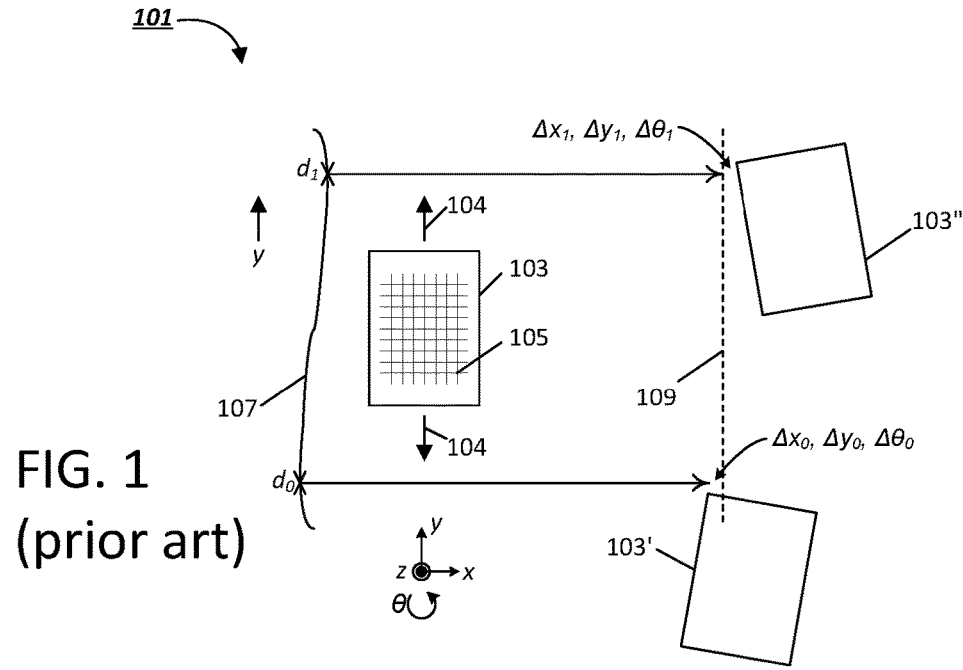
FIG. 1 illustrates a substrate 103 as it is transported through an industrial printing system along a transport path 107; at its right side.

The subject matter defined by the enumerated claims may be better understood by referring to the following detailed description, which should be read in conjunction with the accompanying drawings. This description of one or more particular embodiments, set out below to enable one to build and use various implementations of the technology set forth by the claims, is not intended to limit the enumerated claims, but to exemplify their application. Without limiting the foregoing, this disclosure provides several different examples of techniques for mitigating transport path error in a manufacturing apparatus or printer, and/or for fabricating a thin film for one or more products of a substrate as part of a repeatable print process. The various techniques can be embodied in various forms, for example, in the form of a printer or manufacturing apparatus, or a component thereof, in the form of control data (e.g., precomputed correction data or transducer control data), or in the form of an electronic or other device fabricated as a result of these techniques (e.g., having one or more layers produced according to the described techniques). While specific examples are presented, the principles described herein may also be applied to other methods, devices and systems as well.

DETAILED DESCRIPTION

This disclosure provides improved techniques for correcting transport path error and/or for fabricating a layer on a substrate with a high degree of positional accuracy. In one embodiment, these techniques are applied to a manufacturing apparatus or system that produces a layer of an electronic display, a solar panel or another electronic device or product.

More specifically, in specific embodiments discussed herein, a printer deposits droplets of liquid onto a substrate, where the droplets will meld to form a continuous coat of liquid, and where the liquid serves as the source of material will be used to form the desired layer; the liquid for example can be a monomer that is then cured in situ to form a polymer, or it can carry a material that will form the desired layer as the liquid is dried or baked. During deposition of the droplets, the substrate—or another component of the printer such as a camera or printhead—is advanced along a transport path. The transport path or conveyance system is characterized by very slight imperfections that create at least one error of translational error or rotational error affecting deposition of the material and/or individual droplets on the substrate. These errors can be repeatable, e.g., in an assembly-line style process, imperfections in the transport path can affect every new substrate in a predictable way.

To correct for and/or mitigate error, in one embodiment, fine-positioning transducers are driven without a fixed pivot point to counteract the mechanical imperfections. These transducers perform fine tuning of substrate position and/or orientation, and thereby counteract the effects of the mechanical imperfections in at least one dimension. In this manner, although the conveyance system (e.g., the gripper, substrate, printhead, camera or other transport path) continues to be characterized by mechanical imperfections, motion of the substrate and/or printhead is made to approximate ideal travel. In one embodiment, a transport path is linear and transport occurs along a first dimension (e.g., the "y"-dimension) while two or more transducers each independently apply linear offsets in an independent dimension (for example, the "x"-dimension). Driven in common mode, these transducers permit offset of imperfections associated with the conveyance system which affect "x"-dimensional position of the substrate. For example, the transported thing can be made to travel a virtual straight edge in the "y"-dimension. Driven in differential mode, the transported thing can also be rotated in the "xy" plane, to correct for orientation error also caused by mechanical imperfections of the transport path.

For example, in a split-axis system used for fabricating electronic devices on a substrate, a "gripper" can be used to move the substrate along a first dimension (e.g., the "y"-dimension). The gripper has a first component that rides along an edge or track and a second component (typically a vacuum device) that engages and locks to the substrate; the transducers can be positioned operatively between these components so as to provide selective offset between the first component and the second component at two or more respective points of interaction, to provide both common and differential mode displacement as referenced above. As the first component experiences translational and rotational excursions caused by mechanical imperfections in the conveyance system (e.g., in a second dimension), the transducers are driven so as to exactly equalize those excursions in that dimension, and essentially provide for the second component a "virtual edge" or "virtual transport path" uncharacterized by mechanical error. Note that errors can be linear or nonlinear and the corrections correspondingly can be linear or nonlinear. In optional embodiments, this type of system can be embodied in a printer or printing system, e.g., with the y-dimension being a substrate transport dimension and/or one of an "in-scan" or "cross-scan" dimension, and with the x-dimension being a printhead transport dimension and/or the other of the "in-scan" or "cross-scan" dimension. Note that the described techniques even in such a system are not limited to printhead/substrate transport and, for example, without limitation, can also be applied to correct for motion of a camera, a measurement device or other component; note also that the various mentioned dimensions, axes, and associated reference frames are arbitrary and can be inverted or swapped for other reference frames or for other degrees of freedom.

In one embodiment, mechanical imperfections can be measured in advance, with corrections then stored, computed, "played back" and/or "read out" during each new deposition (e.g., for each ensuing substrate in a series) so as to counteract repeatable mechanical error in at least one dimension. These corrections can be indexed according to any desired variable, for example, transport path position, temperature, specific print recipe and/or other variables. In such an embodiment, the mechanical imperfections can optionally be occasionally or periodically remeasured to account for changing conditions (e.g., degradation of mechanical parts). In an assembly-line style fabrication process for example, such techniques can be applied to "play" stored error corrections as a function of position of the conveyance system (e.g., of the first component), to cancel repeatable or predictable motion or position error.

There may be multiple transport paths in a manufacturing system, and these techniques can be applied to any one of these transport paths or any combination of them, and can be applied to correct positional error in one dimension (or rotational error) or errors in multiple dimensions. Several examples will help underscore this point.

First, in one contemplated implementation, these techniques are used to correct for cross-scan dimensional error in substrate position as a function of gripper position along a transport path. A gripper has first and second components as referenced above and linear transducers that operatively couple these components in at least two points of interaction, with the transducers structured so as to provide for a "floating" pivot point. As the first component travels down a conveyance path, the transducers are controlled so as to provide "common-mode" and "differential-mode" offsets that repeatably provide for translational offset in the cross-scan dimension and rotational adjustment of the substrate. The substrate therefore is advanced in a straight path notwithstanding mechanical imperfections of the transport system. Various embodiments of the mentioned transducers will be provided below but, briefly, in one embodiment, "voice coils" can be used for these transducers, so as to provide very precise, microscopic throws. To help provide structural support and interconnection between the first and second components, a floating, mechanical pivot assembly compatible with the common and differential drive modes can also optionally be used.

Second, in an optional extension to this first example, gripper position (and/or the position of the second component of the gripper) can also be corrected in an in-scan dimension. For example, in one embodiment, an electronic drive signal (used to advance the gripper, or otherwise used to trigger printer nozzle firing) is adjusted so as to correct for positional error of the substrate in the in-scan dimension. It is also possible to use another transducer (e.g., another voice coil or other transducer) to offset the first component relative to the second component in the in-scan dimension. In a first technique, in-scan positional error can be measured and used to offset individual nozzle firings (i.e., as the printhead(s) and substrate move relative to each other, so as to effectuate nozzle firing at precisely the corrected, intended in-scan positions); for example, delays in nozzle firings can be calculated and programmed into a printhead for each nozzle, with firings then driven off of a common trigger signal. In a second technique, a common or shared nozzle trigger signal can be generated as a function of gripper position (and/or position of the first component of the gripper) and can be corrected for error so that the trigger signal is generated so as to simulate error-free movement of the gripper.

In yet another contemplated implementation, the basic techniques can be applied to correct for error in still other ways. For example, a printhead assembly that travels in the cross-scan dimension has a first component that follows a path or edge and a second component that mounts one or more printheads; transducers are used to couple the first component to the second component in at least two points of interaction, just as referenced above for the gripper, with transducers similarly structured so as to provide for a "floating" pivot point. As the first component travels down a conveyance path, the transducers are controlled so as to provide "common-mode" and "differential-mode" offsets that repeatably provide for translational and rotational adjustment relative to the in-scan dimension. Errors in printhead position are therefore mitigated, such droplets are ejected at precisely the correct position relative to the printer's frame of reference. Again, various embodiments of the mentioned transducers will be provided below, but briefly, in one embodiment, these transducers can also be voice coils which provide for microscopic throws.

In an optional extension, the first and second components and the transducers in this second example can be structured so as to instead provide for cross-scan dimensional correction, or both in-scan and cross-scan dimensional correction. As alluded to earlier, transducers in the first example referenced above can also be structured so as to instead provide for in-scan dimensional correction, or both in-scan and cross-scan dimensional correction (i.e., of substrate position). These various techniques can be mixed and matched in any desired combination or permutation. As also alluded to earlier, in one possible application, transducers associated with one conveyance system (e.g., the gripper) can be used to correct for error in another conveyance system (e.g., as a function printhead position along an independent transport path); as will be further discussed below, such a technique can also be applied to correct for discrepancies in coordinate system non-orthogonality.

Reflecting on the principles discussed thus far, at least one transducer can be used to correct for transport path error by displacing a thing being transported in a dimension orthogonal to the direction of transport using both common-mode and differential-mode control. In a still more detailed embodiment, this type of control can be applied to correct for transport path error in two different transport paths, for example, to "y"-axis motion of a first transport system and to "x"-axis motion of a second transport system, using respective sets of transducers. Correcting two different transport paths in this manner, in one implementation, causing each transported object to follow a virtual straight edge, facilitates precise correction over deposition and/or fabrication parameters. For example, in the context of a split-axis printing system, introduced above, correction of both of gripper/substrate path and printhead path effectively normalizes the print grid, and provides for a system where the system's understanding of print grid coordinates is precisely correct and is not undermined by errors in mechanical systems associated with transport. These techniques and their various combinations and permutations help provide for precise positional control over deposited droplets, optionally with others of the techniques described herein and/or the various documents incorporated by reference. For example, these techniques can be further applied to "z-axis" (e.g. height) or other dimensional motion control; alternatively, the techniques described herein can be combined with per-nozzle droplet parameters and/or nozzle parameters, as for example described in U.S. Pat. No. 9,352,561 and US Patent Publication No. 20150298153.

This disclosure will roughly be organized as follows: (1) FIGS. 1-2F will be used to provide an introduction relating to depositing a material on a substrate, causes of fine alignment error and associated remedies; (2) FIGS. 3A-4D will be used to introduce more specific techniques, that is, relating to on-line and off-line processes relating to measuring/detecting and counteracting error in a contemplated print environment; (3) FIGS. 5-6E will be used to describe specific mechanical structures in one or more detailed embodiments; and (4) FIGS. 7A-B will be used to discuss a system used to measure and/or prerecord measurement error for a transport path.

Prior to proceeding to the introduction, it would be helpful to first introduce certain terms used herein.

Specifically contemplated implementations can include an apparatus comprising instructions stored on non-transitory machine-readable media. Such instructional logic can be written or designed in a manner that has certain structure (architectural features) such that, when the instructions are ultimately executed, they cause the one or more general purpose machines (e.g., a processor, computer or other machine) each to behave as a special purpose machine, having structure that necessarily performs described tasks on input operands in dependence on the instructions to take specific actions or otherwise produce specific outputs. "Non-transitory" machine-readable or processor-accessible "media" or "storage" as used herein means any tangible (i.e., physical) storage medium, irrespective of the technology used to store data on that medium, e.g., including without limitation, random access memory, hard disk memory, optical memory, a floppy disk, a CD, a solid state drive (SSD), server storage, volatile memory, non-volatile memory, and other tangible mechanisms where instructions may subsequently be retrieved by a machine. The media or storage can be in standalone form (e.g., a program disk or solid state device) or embodied as part of a larger mechanism, for example, a laptop computer, portable device, server, network, printer, or other set of one or more devices. The instructions can be implemented in different formats, for example, as metadata that when called is effective to invoke a certain action, as Java code or scripting, as code written in a specific programming language (e.g., as C++ code), as a processor-specific instruction set, or in some other form; the instructions can also be executed by the same processor or different processors or processor cores, depending on embodiment. Throughout this disclosure, various processes will be described, any of which can generally be implemented as instructions stored on non-transitory machine-readable media, and any of which can be used to fabricate products. Depending on product design, such products can be fabricated to be in saleable form, or as a preparatory step for other printing, curing, manufacturing or other processing steps, that will ultimately create finished products for sale, distribution, exportation or importation where those products incorporate a specially-fabricated layer. Also depending on implementation, the instructions can be executed by a single computer and, in other cases, can be stored and/or executed on a distributed basis, e.g., using one or more servers, web clients, or application-specific devices. Each function mentioned in reference to the various FIGS. herein can be implemented as part of a combined program or as a standalone module, either stored together on a single media expression (e.g., single floppy disk) or on multiple, separate storage devices. The same is also true for error correction information generated according to the processes described herein, i.e., a template representing positional error as a function of transport path position can be stored on non-transitory machine-readable media for temporary or permanent use, either on the same machine or for use on one or more other machines; for example, such data can be generated using a first machine, and then stored for transfer to a printer or manufacturing device, e.g., for download via the internet (or another network) or for manual transport (e.g., via a transport media such as a DVD or SSD) for use on another machine. A "raster" or "scan path" as used herein refers to a progression of motion of a printhead or camera relative to a substrate, i.e., it need not be linear or continuous in all embodiments. "Hardening," "solidifying," "processing" and/or "rendering" of a layer as that term is used herein refers to processes applied to deposited ink to convert that ink from a fluid form to a permanent structure of the thing being made; these terms are relative terms, e.g., the term "hardened" does not necessarily required that the finished layer be objectively "hard" as long as the finished form is "harder" than the liquid ink deposited by the printer. The term "permanent," as in a "permanent layer," refers to something intended for indefinite use (e.g., as contrasted with a manufacturing mask layer which is typically removed as part of the manufacturing process). Throughout this disclosure, various processes will be described, any of which can generally be implemented as instructional logic (e.g., as instructions stored on non-transitory machine-readable media or other software logic), as hardware logic, or as a combination of these things, depending on embodiment or specific design. "Module" as used herein refers to a structure dedicated to a specific function; for example, a "first module" to perform a first specific function and a "second module" to perform a second specific function, when used in the context of instructions (e.g., computer code) refer to mutually-exclusive code sets. When used in the context of mechanical or electromechanical structures (e.g., an "encryption module," the term "module" refers to a dedicated set of components which might include hardware and/or software). In all cases, the term "module" is used to refer to a specific structure for performing a function or operation that would be understood by one of ordinary skill in the art to which the subject matter pertains as a conventional structure used in the specific art (e.g., a software module or hardware module), and not as a generic placeholder or "means" for "any structure whatsoever" (e.g., "a team of oxen") for performing a recited function. "Electronic" when used to refer to a method of communication can also include audible, optical or other communication functions, e.g., in one embodiment, electronic transmission can encompass optical transmission of information (e.g., via an imaged, 2D bar code), which is digitized by a camera or sensor array, converted to an electronic digital signal, and then exchanged electronically.

Also, reference is made herein to a detection mechanism and to alignment marks or fiducials that are recognized on each substrate or as part of a printer platen or transport path or as part of a printhead. In many embodiments, the detection mechanism is an optical detection mechanism that uses a sensor array (e.g., a camera) to detect recognizable shapes or patterns on a substrate (and/or on a physical structure within the printer). Other embodiments are not predicated on a sensor array, for example, a line sensor, can be used to sense fiducials as a substrate is loaded into or advanced within the printer. Note that some embodiments rely on dedicated patterns (e.g., special alignment marks) while others rely on recognizable optical features (including geometry of any previously deposited layers on a substrate or physical features in a printer or printhead), each of these being a "fiducial." In addition to using visible light, other embodiments can rely on ultraviolet or other nonvisible light, magnetic, radio frequency or other forms of detection of substrate particulars relative to expected printing position. Also note that various embodiments herein will refer to a printhead, printheads or a printhead assembly, but it should be understood that the printing systems described herein can generally be used with one or more printheads; in one contemplated application, for example, an industrial printer features three printhead assemblies, each assembly having three separate printheads with mechanical mounting systems that permit positional and/or rotational adjustment, such that constituent printheads (e.g., of a printhead assembly) and/or printhead assemblies can be individually aligned with precision to a desired grid system. Various other terms will be defined below, or used in a manner in a manner apparent from context.

I. INTRODUCTION

FIGS. 1 and 2A-2F are used to introduce several techniques discussed in this disclosure and some of the problems these techniques address.

More specifically, FIG. 1 represents a prior art process 101 associated with some type of transport mechanism. In this specific example, it is assumed that there is a substrate 103 that is to be printed upon with droplets deposited at selected nodes of a print grid 105; the print grid 105 is illustrated as centered in the substrate to denote that in this position, it is indented that droplets of ink from the printhead will land at precise positions with predictability that translates to layer uniformity. Note however, that the print grid, while illustrated in this manner, is defined relative to the printer (not necessarily the substrate) and extends to anywhere that printing can occur (e.g., the printable area can be larger than the substrate). Also, the spacings of vertical lines and horizontal lines are generally thought to be predictably spaced, however, this is typically based on an assumption that advancement along x and y transport paths are accurate (and/or linear). Finally, note also that while a printer, substrate and print grid are exemplified here, these problems are not unique to printers and that techniques described herein can be applied to a wide variety of situations where something is to be mechanically transported, rotated or moved. The context of a printing process, a substrate and a print grid are to be used as a non-limiting, illustrative example to introduce problems and techniques described in this disclosure.

It is assumed that printing will occur as the substrate is generally transported as represented by arrows 104 and, further, that the transport mechanism is to guide the substrate along a path 107; this path is illustrated in FIG. 1 as slightly crooked, representing in this example mechanical imperfections in the transport mechanism (e.g., in some type of edge guide, track or traveler, or other conveyance system used to steer the substrate 103). Note that in a typical industrial printing process, such as for making OLED display panels as described earlier, the substrate might be on the order of two meters by three meters in size, whereas the nonlinearities in path 107 might be on the order of microns or even smaller. The crookedness (or other error) in path 107 as depicted in FIG. 1 is thus exaggerated for purposes of discussion and illustration. Whereas error of this scale might be inconsequential in many applications, in certain manufacturing processes (e.g., the manufacture of OLED displays and/or certain other electronic devices on large substrates), this type of error might limit achievable product size, lifetime, or quality. That is to say, the droplets generally speaking have to be deposited at precise positions so that they meld together and produce a homogeneous layer without leaving gaps or pinholes; the droplets upon landing spread only to a limited extent, and surface irregularity in the finished layer can limit achievable layer thinness and otherwise create quality issues. Even slight misposition of droplet landing locations can affect product quality and/or manufacturing reliability.

FIG. 1 as a figure is conceptually divided into two halves, including a left half and a right half. The left half of the figure shows the substrate 103 and a slightly crooked transport path 107. The substrate 103 is to be advanced back and forth along this path 107 in what is generally designated the "y" dimension, as referenced by arrows 104. Numeral 103 denotes that the substrate is at some point properly aligned with the print grid 105; the print grid as depicted in this FIG. is an abstraction where vertical lines represent the apparent paths of respective nozzles of a printhead as the printhead and substrate are moved relative to each other, while horizontal lines denote a digital firing signal or other ability of a nozzle to be recharged and fire repeated droplets of ink, i.e., the spacings of these horizontal lines typically represent "how fast" the nozzles can be fired. Perhaps otherwise stated, the print grid 105 has nodes, each of which represents an opportunity to eject a droplet of ink; as indicated earlier, it is desired to deposit ink in a manner that is precisely controlled as to position, and leaves no pinholes, which is in part achieved as a function of having precise knowledge as to where each droplet will land on the substrate. Note further that droplets are deposited at discrete positions, but are viscous, and thus typically spread to form a continuous liquid coat having no gaps or irregularities; volume per unit area is generally correlated in advance with a desired thickness or other property of the final layer, and thus droplet densities and relative positions can in theory be selected in a manner (given expected droplet size) to produce the desired effect, e.g., to promote an even layer of desired thickness following spreading and melding of droplets (this is discussed in U.S. Pat. No. 8,995,022, which is incorporated by reference).

The print grid 105 is graphically depicted at the left-half of the FIG. in a manner "squared up" with the substrate 103, denoting that printing will general occur at desired droplet landing locations.

Unfortunately, the errors in the transport path 107 (i.e., the crookedness) can effectively distort the print grid 105, meaning that droplets do not necessarily land where they are supposed to relative to the substrate, because the substrate as advanced experiences fine positional and rotational error. The right hand side of FIG. 1 shows substrate translation and/or orientation error as the substrate is advanced from a first position $d_0$ along the transport path 107, with the substrate position and yaw denoted by 103' relative to a (virtual) ideal "reference edge" 109, to a second position $d_1$ along the transport path, with the substrate position and yaw denoted by 103" relative to the reference edge 109. As seen, the substrate experiences, due to the errors (e.g., crookedness) in the transport path 107, offset and rotational error in multiple dimensions; the error in this example is seen to be horizontal and vertical offset $\Delta x_0$ and $\Delta y_0$, and angular offset $\Delta \theta_0$ when the substrate has been moved to the first position $d_0$, and different horizontal and vertical offset $\Delta x_1$ and $\Delta y_1$, and angular offset $\Delta \theta_1$ when the substrate has been advanced to the second transport path position $d_1$. Because the nature of these errors changes as the substrate is advanced, these errors distort the print grid, meaning that although a planned print process should (in theory) produce the desired layer properties, in fact, droplet deposition can be distorted, creating potential quality issues. If left uncorrected, these various errors may create pinholes, thin zones and other imperfections and that limit the precision and/or quality achievable with the printing systems; once again, this may limit device size (e.g., it may be difficult to impossible to produce high quality miniaturized products or products that have better quality or resolution, such as very thin large area display screens). The effect of error of the type mentioned is to distort the print grid; for example, while the system and print planning might effectively assume a rectilinear print grid (105 in FIG. 1), "y"-error and/or jitter (i.e., parallel to the transport path) effectively distorts the separation between the horizontal lines of that print grid; similarly, "x"-dimension error and/or jitter effectively distorts separation between the vertical lines of that print grid, with the effect of these errors being that error in the system's understanding of where individual droplets are to be deposited. These types of errors might result in too little or too great fluid deposition in various pixel wells, or other non-uniformities, potentially leading to brightness and/or hue variation or other errors in a finished display.

Note also that in this example, the depicted errors in some cases may be simply a repeatable function of the transport path 107, i.e., because the transport path in this example is seen as curved, there is non-linear displacement in the x-dimension, non-linear displacement in the y-dimension, and nonlinear skew; other types of errors, such as z-dimensional error, pitch and roll, can also potentially occur on a repeatable basis but are not depicted in this particular FIG. Thus, in an application such as an industrial printer used to create fine (e.g., micron or smaller scale) electronic, optical, or other structures that rely on uniformity of the type mentioned, and where a series of substrates is to be printed on as part of an "assembly-line" style fabrication process, the same errors can potentially occur from substrate-to-substrate.

While error in the substrate path has been illustrated, there are also potentially other sources of similar error that can affect device quality and/or process reliability. For example, a split-axis printer typically moves not only the substrate, but a printhead or camera, or other mechanical components. Briefly, in systems that move one or more printheads (generally in the "x" dimensions relative to FIG. 1), similar path error can result in "x," "y" rotational or other error in the printhead(s) (relative to the dimensions of FIG. 1). For example, if a printhead has error at different positions, such typically also has the effect of distorting the vertical lines of the print grid 105 (i.e., making them unevenly spaced). Similar analogies can be stated for other transport path analogies in an industrial printing system of the type referenced. It is generally desired to reduce the effects of these layers to improve predictability and reliability in layer fabrication and, generally, to have the ability to fabricate thinner, homogeneous layers.

Figure 2A:
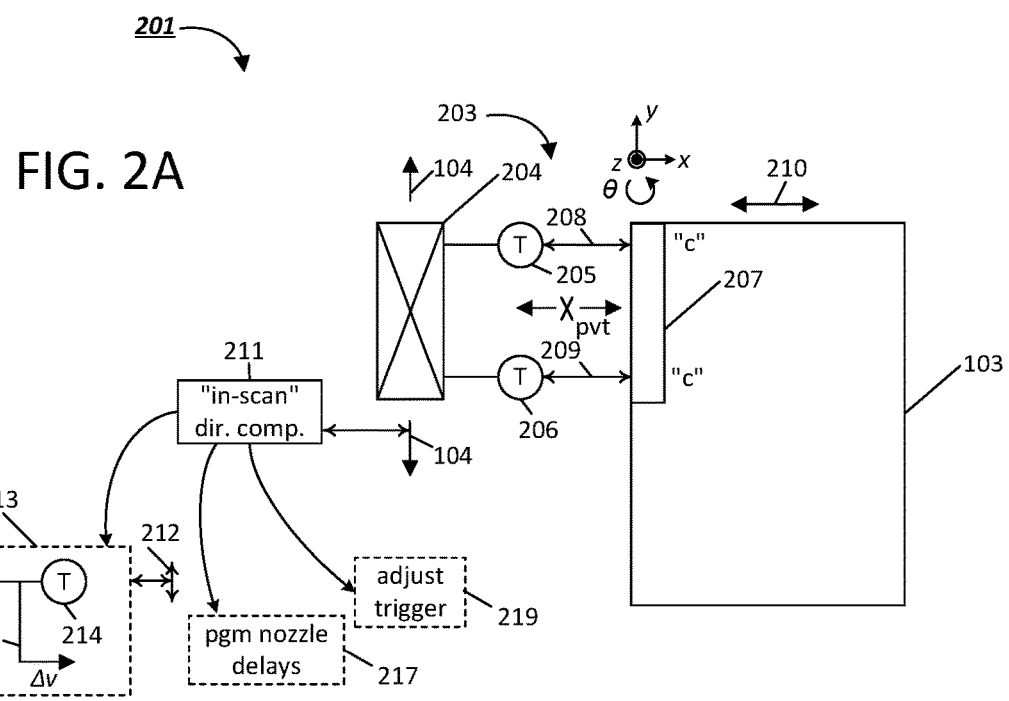
FIG. 2A is a schematic diagram showing one or more transducers that perform fine mechanical adjustments to correct for errors referenced in connection with FIG. 1 (i.e., in this example, as part of a "gripper" that advances the substrate); in one embodiment, repeatable mechanical error is measured in advance, and one or more transducers "T" are driven as a function of transport path position to correct for repeatable substrate rotation and translation error relative to an ideal (e.g., a "perfectly straight" or "jitter free") transport path.

FIG. 2A shows one embodiment 201 for reducing or eliminating some of these issues. More specifically, FIG. 2A shows the substrate 103 from FIG. 1 where it is once again assumed that the substrate is to be advanced back and forth along a path represented by arrows 104. In this example, the substrate will be advanced using a gripper 203 that grips a corner or edge of the substrate 103; a first component 204 of the gripper will travel along path 107 (from FIG. 1), generally in the "y"-dimension. The gripper also has two transducers (T), 205 and 206, which operatively connect the first component 204 with a second component 207, which engages an edge of the substrate. In one exemplary case, the substrate is supported on an air bearing above a floatation table which and the substrate's corner is gripped using a vacuum mechanism, to provide for nearly frictionless support; in other examples, other mechanisms can be used for support and transport. The two transducers each are controlled to displace the second component relative to the first component along a common direction (e.g., in an "x" dimension as illustrated in the FIG.), as represented by arrows 210. Each transducer can be independently controlled, leading to a situation where "common-mode" control offsets the second component linearly away from the first component 204 in the x-dimension at the respective point of engagement, while "differential-mode" control pivots second component relative to the first about a pivot point "$X_{pvt}$." Because the transducers can be electronically driven in a manner having both common and differential drive components, the pivot point "$X_{pvt}$" is seen to be a floating pivot point; in some embodiments, this floating pivot point can be an abstract concept, while in others, a mechanical structure provides this pivot point while also providing a structural coupling between the gripper's two components. The first component 204 follows the (error-encumbered path, 107 from FIG. 1), while the second component locks to the thing being transported (e.g., in this case, the substrate 103, e.g., using a vacuum lock). The transducers 205 and 206 are seen to be independently controllable to move the substrate as indicated by arrows 208 and 209, and are controlled in a manner so as to exactly negate x-dimension- and θ-rotation-induced error in the path 107, with the result that the substrate is moved in a manner that corresponds to an ideal "reference edge" (see line 109 from FIG. 1). Note that in alternative designs, instead of having linear throws that are parallel to one another, transducer 205 could effectuate rotation while transducer 206 could effectuate a linear throw, or the transducers could be made to produce offsets in the "y" dimension or any other desired dimension, with corresponding effect of mitigating substrate position or rotation error. In FIG. 2A, the gripper's first component 204 moves along the "y" dimension, while the transducers 205 and 206 each push and pull the substrate along a linear range of motion along the "x" dimension, via contact at respect contact points "c." Note that each transducer in this example can be a linear motor, a piezoelectric transducer, a voice coil, or another type of transducer.

Note that in the split-axis printing system in this example, the substrate is advanced in the "y" dimension relative to the printhead(s) for a particular "scan" or raster motion; the "y" dimension in this example therefore also forms the "in-scan" dimension. The printhead(s) are then moved in the "x" dimension to reposition the printhead(s) for an ensuing scan (i.e., in the "cross-scan" dimension); the substrate is then advanced in the reverse direction, for the ensuing scan, with successive scans continuing until the entire liquid coat has been created. The substrate can then be advanced (typically out of the printer, to another chamber), where it is cured, dried or otherwise processed so as to convert the continuous liquid coat to a permanent structure having desired electrical, optical and/or mechanical properties. The printing system is then ready to receive another substrate, for example, to perform similar printing on that ensuing substrate according to a common, predefined "recipe."

It was noted earlier that error along transport path 107 (from FIG. 1) can lead to error in multiple dimensions, i.e., not just offset in the x dimension. For example, while motion along path 107 might be controlled for constant velocity, variations in angle of that path might lead to nonlinearities in y-position of the substrate as well. For the embodiment of FIG. 2A, this y-dimensional error can optionally be corrected using means 211 for correcting substrate motion in the "in-scan" dimension, for example, using a third transducer 214 to effectuate throws of the gripper's first and/or second components in the in-scan dimension, to normalize y-dimensional advancement of the substrate. In other embodiments, feedback can instead be used to adjust an electronic control signal 215 (e.g., as a feedback signal, delta signal, or electronic drive signal) for advancement of the gripper, to impart a slight velocity increase or decrease ($\Delta v$) to counteract y-dimensional error, or the gripper's motion can be caused to match positional markers (see further below). In yet another optional embodiment, it is also possible to compute and program individual, y-position dependent nozzle firing delays (as represented by box 217), i.e., the nozzles of the printhead can, in some embodiments, be "told" to print slightly earlier or later as the substrate and printhead(s) are moved relative to each other in the "y" dimension, in a manner that exactly cancels out "y" dimension positional error of the substrate relative to the printer. Also, per numeral 219, in another embodiment, it is possible to adjust a "trigger" signal used to time nozzle firing, to have the effect of shifting the horizontal lines of the print grid (see numeral 105 from FIG. 1) so as to cancel out positional error of the substrate relative to the printer. Note that "in-scan" or "y-axis" compensation of a gripper is not required for all embodiments.

Reflecting on the subject matter of FIG. 2A, it should be observed that by using two or more transducers in a mechanical transport system, one can correct for errors in the transport path or other motion errors (e.g., for a non-linear guide or track or edge). Whereas path errors might exist as represented by numeral 107 in FIG. 1, the techniques and structures introduced above attempt to "live with" this repeatable error in the transport path (e.g., the gripper's first component 204 continues to travel this error-encumbered path), but the transducers effectuate throws or other corrections to negate this path error in at least one dimension, and thus the thing being moved (the substrate in this example) travels an idealized path (or at least, is made to simulate an ideal edge, such as represented by numeral 109 in FIG. 1). In one embodiment, these corrections are effectuated by two or more transducers, each having a linear throw parallel to one another and substantially orthogonal to a direction of conveyance (e.g., transducers 205 and 206, each independently controllable in a direction (e.g., 210) substantially orthogonal to a direction of arrows 104).

While these techniques can be applied to virtually any mechanical transport system, it was earlier mentioned that one field that could benefit from these techniques relates to industrial printers where ink droplets have to be deposited at very precise positions. For example, one contemplated embodiment is as a printer used to fabricate light emitting devices, such as organic LED display devices (e.g., cell phone screens, HDTV screens, and other types of displays), and "panel" devices such as solar panels. In this regard, in the application discussed above (e.g., where a substrate meters wide and long is printed upon), a number of conventional systems rely on an air flotation table to advance the substrate during printing. The gas ingress and egress in such a system can be carefully controlled, to avoid imparting effects to the substrate (e.g., temperature, electrostatic charge buildup or other effects which might influence ink behavior) that could potentially produce defects in the finished layer. In other words, gas flow is used to create a fluidic bearing underneath the substrate, to create a substantially frictionless surface that the substrate is moved on during printing; the gripper 203 from FIG. 2A in such an application can be a vacuum gripper that features a single vacuum lock (as part of second component 207) that effectively engages one contact point on the substrate, or multiple vacuum locks that engage respective contact points along the substrate. In such an application, in order to achieve the "micron-scale" (or smaller) throws used to negate nonlinearities and provide for preside path advancement, the transducers 205 and 206 can advantageously be formed as voice coils which use compression and expansion (i.e., in a direction normal to a direction of force supported by the gas bearing of the floatation table) to effectuate the microscopic throws used to achieve precise printhead and nozzle alignment with the substrate. That is to say, for electronic flat panel fabrication in particular, and for OLED display device fabrication in particular, it has been found that (frictionless) flotation support and the use of a vacuum gripper is important to minimizing defects and maximizing device lifetime, and the use of voice coils as the transducers provide an effective component for providing the required throws in such a system. Other types of transducers, however, can also be used to achieve throws pertinent to the particular type of application, for example, through the use of piezoelectric transducers, linear motors or other types of transducers. In such a system a floating, mechanical pivot mechanism can be used in aid of the voice coils to provide structural linkage and mechanical support for error correction.

Figure 2B:
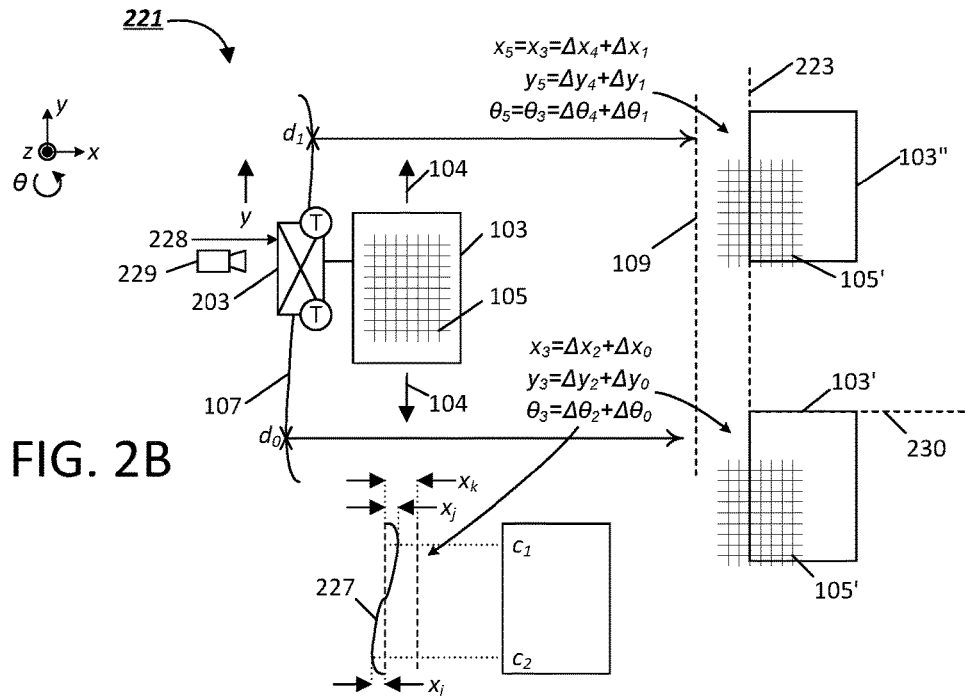
FIG. 2B depicts a transport path 107 having mechanical imperfections, just as with FIG. 1; however, in this case, transducers "T," such as introduced relative to FIG. 2A, are used to perform fine tuning adjustment for the substrate position and/or orientation as the gripper advances on the path 107. The result is that the substrate now moves according to "ideal" motion (e.g., a perfectly straight "ideal" edge and/or jitter free path), as represented by a virtual straight edge 223.

FIG. 2B provides a view 221 similar to the view of FIG. 1, but further illustrates ends attainable using the mechanism of FIG. 2A. More specifically, FIG. 2B shows the substrate 103 and gripper 203 from FIG. 2A as it advances along the path 107. As with FIG. 1, the path 107 is once again assumed to have error manifested as some form of crookedness or variation; once again, this could be error in an edge guide, track or other mechanism—this error imparts positional and/or rotational error to the gripper 203. In this case, however, the gripper is seen as having transducers "T" which are controlled so as to counteract this error, e.g., in the form of voice coil displacements that compensate for or that equalize variations in the path 107. Note again that the magnitude of error is seen as greatly exaggerated relative to the scale of FIG. 2B, e.g., in practice, the path may be meters long (e.g., for a 3 meter long substrate is transported through a room-sized printer), while the crookedness may be on the order of micron or submicron in scale.

At position $d_0$ of the gripper along the path, it will be recalled from FIG. 1 that native transport path error was equivalent to $\Delta x_0$, $\Delta y_0$, and $\Delta \theta_0$. For the system of FIG. 2B, however, the transducers are actuated to displace and/or rotate the substrate, as seen at the lower right hand side of FIG. 2B and as designated by numeral 103'. That is, the transducers "T" displace the gripper's second component and the substrate relative to the gripper's first component and the track or edge guide 107 so as to have absolute position $x_3$, $y_3$ and $\theta_3$. In the context of FIG. 2B, the quantity $x_3$ represents an absolute x-position that effectively defines a virtual edge 223 offset from the error-encumbered transport path 107, the quantity $y_3$ corresponds to optional positioning offset of the substrate to offset it to an arbitrary "smoothed" or normalized advancement relative to the in-scan (or transport) direction, and the quantity $\theta_3$ corresponds to a desired angular orientation of the substrate; for the example of FIG. 2B, it can be assumed for the moment that $y_3$ and $\theta_3$ are "zero," e.g., that the substrate is oriented so as to be exactly vertical (i.e., squared off relative to the flotation support table, without "y"-dimensional correction, though this need not be the case for all embodiments). In FIG. 2B, the print grid is depicted at numeral 105' to have a consistent x and $\theta$ relationship relative to the substrate 103'; as the substrate is advanced from position $d_0$ to position $d_1$, the transducers are controlled so as to maintain this consistent positional relationship between the substrate and the vertical lines of the print grid, i.e., such that the substrate is aligned (notwithstanding error along the path 107) to have absolute position $x_3$ and $\theta_3$, and is thus depicted at 103" as having exactly this relationship relative to the print grid at 105". Note that in these examples, although the print grid is illustrated as maintaining a predetermined relationship relative to the substrate, the print grid is defined by the printhead positioning and substrate and printhead conveyance systems, and what is really desired is that the printhead and substrate conveyance mechanism maintain a consistent, predetermined relationship relative to each other, and that a coordinate system established by this linkage be precisely aligned relative to each product being fabricated; in some embodiments, the substrate (or a product being fabricated thereon) is therefore specially aligned relative to the print grid (i.e., to the printer) via a per-product or per-substrate alignment process—this will be further exemplified below. For the present, it will be assumed that the substrate (e.g., a reference edge thereof, or a juxtaposition of fiducials on the substrate) is what is being maintained in a predetermined relationship relative to the print grid.

Equations are depicted at various positions in the FIG. to indicate how a constant positional relationship is maintained. More specifically, it will be recalled that native, repeatable error in the transport path 107 at position $d_0$ equated to positional and rotational offsets of $\Delta x_0$, $\Delta y_0$, and $\Delta\theta_0$. The transducers "T" are therefore controlled so as to add further offsets of $\Delta x_2$, $\Delta y_e$, and $\Delta\theta_2$, where these values are a function of position $d_0$ along the transport path and pre-measured error at the corresponding transport path position (e.g., position $d_0$ along path 107). That is, in one embodiment, these values are determined (measured) in advance and are dependent on the negative of the error $\Delta x_0$, $\Delta y_0$, and $\Delta\theta_0$, i.e., they exactly cancel the error and optionally offset the substrate to some predetermined x/y/$\theta$ value. These values can be stored and then used, in combination with a predetermined "recipe" representing fabrication of like-products from many substrates, to print accurately on each substrate in a succession or series of substrates in an assembly-line style process. In one embodiment, the depicted transducers "T" only correct the substrate position in x and $\theta$ (e.g., any "y" dimensional correction is optionally effectuated using one or more other transducers or mechanisms not depicted in the FIG.). Note how at position $d_1$, the transducers are controlled so as to add different offset as a function of position on the transport path 107, i.e., to add offsets of $\Delta x_4$, $\Delta y_4$, and $\Delta\theta_4$. As depicted in FIG. 2B, values $x_5$ and $\theta_5$ can be exactly equal to values $x_3$ and $\theta_3$, though once again, this need not be the case for all embodiments.

It should be noted that in one contemplated embodiment, the printer's support platen (i.e., the flotation table in the example just discussed) has predefined optical markings that provide a position reference system for the printer—the print grid is linked to and defined relative to this system. The optical markings for example can be formed physically onto the support table or be added, for example, via an adhesive tape.

Positional control at micron scale or better in many respects is less intuitive than it might seem, e.g., in one embodiment, each of the gripper transport system and the printhead transport system mounts a camera, which is used to find a common alignment mark and thereby establish a origin for a coordinate system matching the two transport paths. This process, and the conveyance systems for each of the printhead(s) and substrate in such a system, effectively define the printer's coordinate reference system (and in large part determine configuration of a print grid according to which droplets can be deposited). U.S. Provisional Patent Application No. 62/459,402, incorporated earlier by reference, provides information relating to the use of these cameras, position detection, and related calibration; basically stated, in addition to finding a common coordinate (or "origin") point in one disclosed system, each conveyance system uses an optical tape and optical sensor to provide precise (e.g., micron-by-micron) position detection and feedback, so the conveyance system (e.g., first component of the gripper) "knows" exactly where it is relative to the printer's coordinate system, and these various components cooperate to effectively define a complete printer coordinate system; indeed, the use of such a system can obviate the need for y-dimension gripper path correction, e.g., the gripper is simply driven to the specific position value along the y-dimension.

Once the "origin point" is established by the referenced camera-alignment process, the two conveyance systems are articulated to determine relative coordinates between each conveyance system's camera and a reference point of the conveyance system (e.g., corresponding to a printhead nozzle position for example), and this then permits a precise identification of any point relative to the printer's coordinate system. As noted earlier, in such a system, the printer's "understanding" of droplet landing locations is dependent on the print grid, which in turn is defined by this coordinate system; transport path motion error in such a system could potentially lead to a situation where a particular print grid location (e.g., associated with an understanding of combined specific gripper/printhead position) deviates from actual position of these components. By correcting transport path error in the manners described herein, using the various devices described herein, this permits the system to correct for that path error such that a substrate and printhead are each positioned in a manner corresponding to print grid assumptions. In fact, as noted above relative to prerecorded error measurement, even errors such as minor non-orthogonality between the transport paths can be corrected using optional rotational offsets (e.g., non-zero values for $\theta_3$ and $\theta_5$).

Continuing with the example provided by FIG. 2B, each substrate that is then introduced into the system has one or more fiducials that are identified and used to precisely understand position of the substrate (or a panel product thereon) during printing; as each substrate is introduced, its fiducials are detected (e.g., using one or more of the cameras), and a mechanical system can be used to properly orient/align the substrate so as to correspond to an expected position (note that this process is not necessary for all embodiments, e.g., it is also possible to adjust printer control information to accommodate known substrate misalignment or disorientation).

During a calibration process, a test substrate can be advanced through the printer in a manner corresponding to the desired recipe; an optical inspection device (e.g. a camera) can be used with image processing techniques to precisely measure positional and rotational error in each dimension of interest. Motion and/or printing then occurs according to the desired recipe, and optical inspection is performed continuously or intermittently to measure position and orientation errors as the substrate is advanced, e.g., to detect repeatable error that deviates from expected position/orientation as determined relative to advancement of each of the conveyance systems (along their respective paths). These errors and/or corresponding corrections are then stored in digital memory of the system (e.g., in an SSD, RAM or other non-transitory media) in a manner indexed according to conveyance path position (e.g., position of the gripper's first component along path 107), according to time, or in another manner. As implied, measured errors are used to develop repeatable-error correction values for the transducers.

During "live printing" of a substrate in the assembly-line style process, fiducials on each substrate are then once again used to determine per-substrate precise position relative to the printer and/or realign/reorient the substrate just as was done with the test substrate. The stored transducer corrections are then retrieved from memory as a function of gripper/printhead assembly-measured position and used to drive the transducers of the (printhead and/or gripper) error correction mechanism in order to provide compensating motions that position the substrate precisely relative to the printhead. During printing, printhead and gripper positions are continually used with the stored, predetermined error measurements/corrections in order to drive the substrate to the correct "cross-scan" position (and/or other position or orientation) of the substrate relative to the flotation table and the printhead.

The bottom portion of FIG. 2B shows how two linear transducers (e.g., voice coils) on the gripper can correct for rotational error as well as positionally offset the substrate in a manner corresponding to an idealized edge (e.g., via displacement in the "x" dimension). More specifically, a localized portion of the transport path is designated by numeral 227 as having a fair amount of curvature, which deviates from an idealized straight edge 109 of the transport path. At two effective contact points between the substrate and the transport path (designated "$c_1$" and "$c_2$," respectively), this error is respectively assumed to be "$x_i$," (depicted as a offset relative to the idealized straight edge in a negative direction) and "$x_j$" (depicted as an offset relative to the idealized straight edge in a positive direction); here, it is assumed that it is desired to precisely position a left edge of the substrate (or a printable area of the substrate) at absolute position "$x_k$" from the idealized transport path (e.g., corresponding to depicted virtual edge 223); numeral 105' denotes a slight offset of the print grid so as to accommodate the entire range of "x" positional error imparted by the system and optionally provide some slight buffer. To effectuate this correction, the positive error at position "$c_1$" (i.e., $x_i$) is further offset by an amount of "$x_k-|x_i|$," while the negative error at position "$c_2$" (i.e., $x_j$) is further offset by an amount of "$x_k+|x_j|$." The two depicted transducers "T" are controlled to this end and so straighten the substrate relative to the idealized straight edge; similar corrections are performed at all other times during movement of the gripper along the transport path 107 in dependent on error at the pertinent position, i.e., such that the substrate follows the virtual path associated with absolute position "$x_k$."

Several points should be noted relative to this discussion. First, although the gripper 203 is depicted in this FIG. as a single unit, in fact, it can consist of many parts (e.g., the aforementioned first and second components, or as a distributed series of 2, 3, 5 or another number of grippers or gripper components that engage the substrate at different locations). Second, while in this embodiment, the two transducers are depicted as parallel linear actuators (e.g., each a voice coil or piezoelectric transducer), this is not required for all embodiments. That is, depending on embodiment, the transducers "T" can be coupled in series, and can be rotational, linear or other types of actuators; in still other embodiments, more than or fewer than two transducers can be used. Third, it is noted that in various other embodiments or implementations, the corrections imparted by the transducers as a function of transport path position can be derived and/or applied in a number of ways. In a first embodiment, a test device (e.g., a test substrate) having positional sensors (e.g., optical, radio frequency or other detectors) can be advanced along the transport path in an offline process and continuously measured for positional and/or rotational error, which is recorded as a function of advancement along the transport path. A series of time-based or position-based corrections can then be developed and formatted as control signals for the transducers; then, during manufacturing (or other run-time use of the transport path), an input corresponding to position along the transport path is received (e.g., a time measurement, a position measurement, an analog signal or digital signal, or some other value) and is used to look up or index the proper transducer control signal(s), which is (are) effectively "played back" or otherwise applied as a function of transport path position (and potentially multiple transport path positions). Finally, as noted above, a variety of mechanisms exist to identify position along the transport path, for example, a signal (e.g., drive signal, timing signal, etc.) can be used for this purpose, as denoted by numeral 228, or a position sensor 229 can be used; in one specifically contemplated embodiment, as referenced above and discussed in U.S. Provisional Patent Application No. 62/459,402, a position marking system and position detector is used for each conveyance path, to measure associated position (e.g., for printhead transport and substrate transport). Clearly, many alternatives are possible.

Figure 2C:
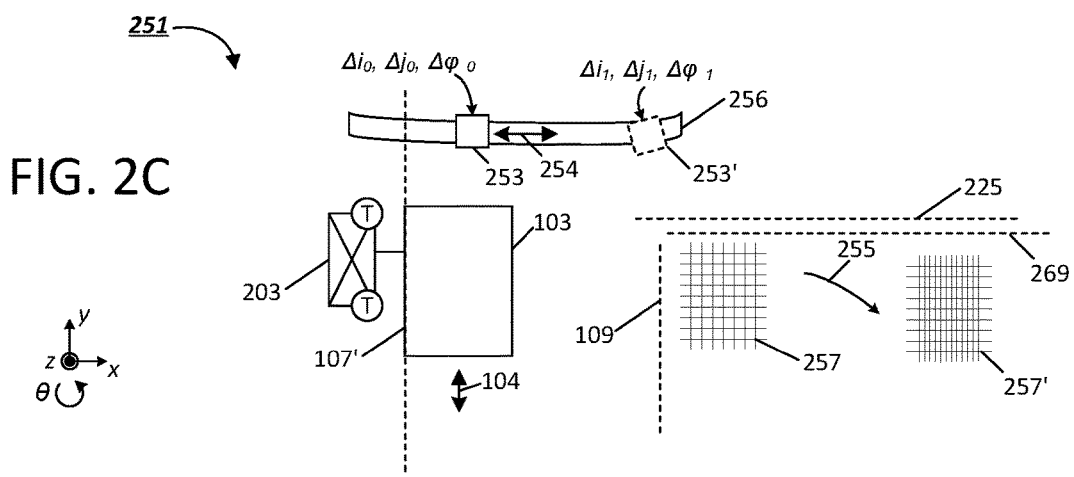
FIG. 2C is similar to FIG. 2B, in that it shows use of transducers "T" to correct for transport path error. However, in this case, error also potentially arises from a second transport path 256, in this case, manifested as the non-ideal motion of a printhead (or camera or other assembly) as it travels along in the general direction of arrows 254.

As referenced earlier, a fabrication apparatus or system can have multiple conveyance paths; in the context of a split-axis printer, in one embodiment as referenced earlier, a printer coordinate reference system can be defined in dependence on separate printhead and substrate transport paths. FIG. 2C is used to discuss positional error stemming from inaccuracies in a second transport path such as the printhead transport path. Such a context is generally depicted by numeral 251 in FIG. 2C. A substrate is advanced by a gripper in a first dimension (represented by arrows 104) and a printhead is advanced along a second transport path 256 in a second dimension (i.e., represented by arrows 254). At a first position 253 of the printhead along the second transport path, the printhead experiences error of $\Delta i_0$, $\Delta j_0$, and $\Delta \varphi_0$; note that the variables i, j and φ represent x and y offsets (and angular rotation in the xy plane), but that i, j and φ are used instead of x, y and θ to distinguish this example from that of the gripper conveyance system. As denoted in phantom lines at the right side of the FIG., as the printhead is advanced to position 253', the error becomes $\Delta i_1$, $\Delta j_1$, and $\Delta \varphi_1$. Once again, this error is a function of position along the transport path 256, with change in error potentially being linear or non-linear. If left uncorrected, this error would also distort printing and create the manufacturing precision issues as referenced earlier. Note that in this example, it is assumed that any motion of the substrate 103 relative to the gripper's transport path is corrected using the depicted gripper 203 (and its transducers "T"), but the issue is that the printhead traveler also might create error, resulting in x, y or θ error of the printhead, and which changes the expected landing positions of droplets ejected from nozzles of the printhead. The effects of these errors are exemplified relative to an intended print grid 257 as indicated by arrow 255, i.e., the effect of unintended printhead rotation (and/or unintended "x"-dimensional displacement) is seen via distorted print grid 257' (in analogous fashion, unintended printhead rotation displacement in the "y"-dimension would effectively result in a 'squeezing together' of vertical print grid lines).

In the context of the FIG., it is also desired that the printhead experience ideal motion, that is, motion uncharacterized by unintended mechanical error. That is to say, in this example, it is desired that the printhead also follow a virtual, ideal (e.g., straight) transport path 225, such as will effectively correspond to an unperturbed print grid (e.g., denoted by numeral 257); this is achieved in one embodiment by causing both virtual, "ideal" gripper motion, denoted by vertical line 109, as well as virtual, "ideal" printhead motion, represented by horizontal line 225.

In a manner much the same as with gripper path correction, a conveyance system for the printhead transport path can optionally also use a set of transducers to facilitate idealized printhead positioning; to this effect, the transducers advantageously provide displacement to an arbitrary "absolute" position that accommodates the entire range of "y" positional error of the printhead optionally provide some slight buffer, such that the printhead motion corresponds to a virtual path 269 that also provides a fixed, known position corresponding to the "offset" print grid (105' from FIG. 2B).

FIG. 2D provides an illustration 261 of a system intended to redress this type of error. That is, FIG. 2D shows a second transport path 256 used to support lateral motion of one or more printheads, in the general direction indicated by arrows 254. A printhead assembly includes a first component 263, which rides along the transport path 256 (e.g., along a track or guide), and a second component 264, which mounts the printhead(s). These first and second components are operatively coupled by one or more transducers 265. The transducers in this example are each linear actuators which support micro-throws that offset the second component in the "y" dimension, with common-mode and differential mode drive once again being used to selectively effectuate linear displacement and/or xy plane rotation (θ). As denoted by both numeral 267 and numeral 267' (each representing the printhead(s) at respective positions along the "cross-scan" or "x" dimension), correction permits the printhead(s) to follow a virtual ideal path 269 uncharacterized by mechanical error (i.e., even though the first component 263 continues to travel the error-encumbered second transport path 256). Just as was the case with the gripper embodiment, the transducers of FIG. 2D can be controlled to offset the printhead to an absolute y position (i.e., corresponding to line 269) such that when the printhead is at position 267, the aforementioned error of $\Delta i_0$, $\Delta j_0$, and $\Delta \varphi_0$ is further offset by $\Delta i_2$, $\Delta j_2$, and $\Delta \varphi_2$, and such that when the printhead is at position 267', the transducers are controlled to offset the printhead to add offset $\Delta i_4$, $\Delta j_4$, and $\Delta \varphi_4$; i and φ typically have a constant value at position 267 and position 267' and are both also typically zero, but again, this is not required for all embodiments. Just as with the prior gripper example, the depicted transducer configuration is exemplary only, and different transducers (e.g., rotational transducers) can be used, and can be applied to different conveyance systems and/or dimensions. Further, just as with the prior example, the depicted transducers in this embodiment offset the printheads using both common and differential mode control to effectuate a floating pivot point; the result is that a desired "error free" transport path 225 is offset to an arbitrary position 269, sufficient to encompass any "y" or in-scan dimensional jitter which is attributable to imperfections in the second transport path 256. As indicated by numeral 255', the result of these corrections (and the optional use of gripper corrections as referenced earlier) effectively normalizes the print grid, as indicated by numeral 257". Note that as referenced by function box 271, it is also possible to use another transducer 273 or to use drive signal correction techniques 275 to offset position of part or all of the printhead assembly to correct cross-scan positional error.

Reflecting on the principles discussed thus far, correction of each of the substrate path to a "virtual," straight edge, and the printhead path to a "virtual," straight edge, permits both of the substrate and the printhead to be placed in a manner so as to conform to print grid assumptions (e.g., to the printer's coordinate reference system) notwithstanding fine error imparted by the mechanical systems. These techniques may optionally be combined with drive control techniques (or other described techniques to correct each transported thing along its dimension of transport) to further improve system accuracy. Once again, these techniques can also be extended to other motion dimensions and fabrication and/or mechanical systems as well.

FIG. 2E presents another example 281, namely, an alternative embodiment where error in one transport path can be corrected using one or more transducers "T" associated with a second transport path. In this case, it can be assumed that a gripper assembly 203 includes two linear transducers that are controlled once again in common- or differential-drive modes to effectuate cross-scan and rotational correction without a fixed pivot point. Note that in the case of this FIG., errors are once again micron or nanometer scale; the depicted angles and offsets are therefore greatly exaggerated in the FIG. to assist with description. In this case, the FIG. shows "two grippers" 203, which in reality represent exactly the same gripper and position of the gripper along the "in-scan" dimension for two different scans; in this case, however, one of the conveyance paths (i.e., path 256, for the printhead assembly) does not have its own error correction system. The gripper's error correction system is therefore controlled to also correct for printhead conveyance path error, in this case, by linearly superimposing offsets to correct for the printhead transport system onto those corrections used to correct for gripper path error in dependence on scan. That is to say, in this embodiment, it should be assumed that the two grippers represent two alternate sets of transducer control signals that respectively correct for printhead system error $\{\Delta i_0, \Delta j_0,$ and $\Delta \varphi_0\}$ at printhead position 273' and $\{\Delta i_t, \Delta j_1,$ and $\Delta \varphi_1\}$ at printhead position 273" (i.e., corresponding to respective scans). That is, even though it was assumed in connection with FIG. 2B that gripper transport in the "y" dimension had been corrected to an ideal edge (relating to the gripper transport path), through the use of mitigating offsets and angles provided by the gripper systems' transducers, in one embodiment, one may also correct for errors in the printhead path (or another independent transport path) using these same transducers. As depicted, further offset and/or rotations are added so as to effectively reposition the substrate so as to have the intended position and orientation relative to the printhead (e.g., to produce motion in a way that matches printhead error, as denoted by alternate transformed edges 107''' and 107''''').

As this discussion implies, while the previous examples show correction of error in two transport paths, the principles described in reference to FIG. 2E can be applied to correct for fine error in any number of transport paths, e.g., one, two, three, four, five and so forth, with corrections for multiple transport paths being applied to a single drive path (e.g., to transducers used for substrate conveyance) or to a fewer number of drive paths. Note that this discussion also applies to non-orthogonality, e.g., where the gripper and printhead transport paths are not exactly at ninety degrees separation; this can be treated as equivalent to a case of measured printhead x-position-dependent error. Also, while the term "transport path" is exemplified in the figures as positional change along a curvilinear path, the principles discussed above and fine error correction procedures can also be applied to correct for fine error in any transport dimension, i.e., including rotation and accurate angular orientation—for example, in an embodiment where a mechanism is rotated, it is possible to measure "jitter" in angular rate of change or orientation, and to use transducers and/or drive signal correction as exemplified above to correct for such fine error.

II. MEASURING AND/OR DETECTING AND COUNTERACTING ERROR IN A FABRICATION APPARATUS

Figure 3A:
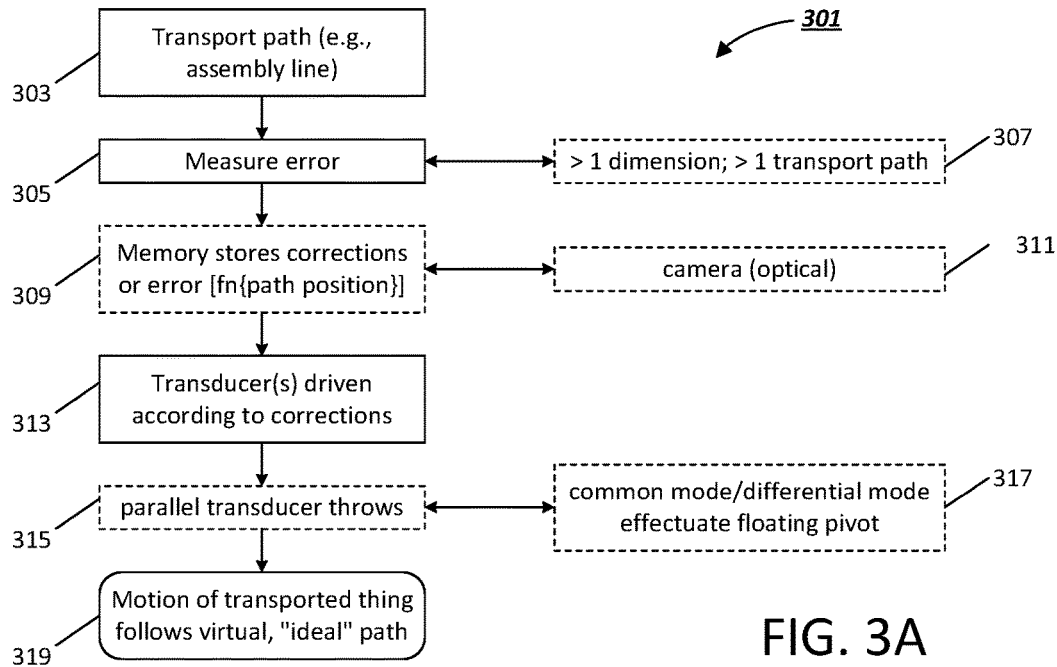
FIG. 3A is a flow chart associated with correcting positional and/or rotational error as a transported thing is advanced along a transport path.

FIG. 3A is a flow chart that depicts method steps 301 that implement some of the techniques introduced above. As denoted by numeral 303, the method can be embodied in a system having a transport path where it is desired to correct for fine motion, position or orientation error of the motion system; for example, a system can perform high precision product "assembly-line-style" manufacturing using a printer for materials deposition, as introduced previously. Error is measured, per 305, optionally in more than one dimension or for more than one transport path, as indicated by numeral 307. Either this error, or associated corrections to be applied to one or more transducers, are then stored in digital memory as a function of path position (or another similar reference, for example, elapsed time, as a function of drive signal, temperature, etc.), per numeral 309. As indicated by numeral 311, in one embodiment, path position is optically detected using a camera or other optical sensor; for example, as referenced earlier, in a split-axis precision printing system, such a sensor can be used to measure marks on an adhesive tape proximate to the conveyance path, e.g., with alignment marks for every micron of travel along the transport path. During transport (e.g., during product manufacture), the stored errors and/or corrections are read out of memory as a function of this position and/or other factors and used to drive one or more transducers to effectuate position and/or orientation correction, per numeral 313. As denoted by numerals 315 and 317, in one embodiment, there can be multiple transducers, each optionally configured so as to effectuate a parallel micro-throw, optionally without a fixed pivot point, as introduced in FIG. 2A. The result is that the thing being transported follows a virtual, ideal path, as referenced earlier and as identified by numeral 319.

Figure 3B:
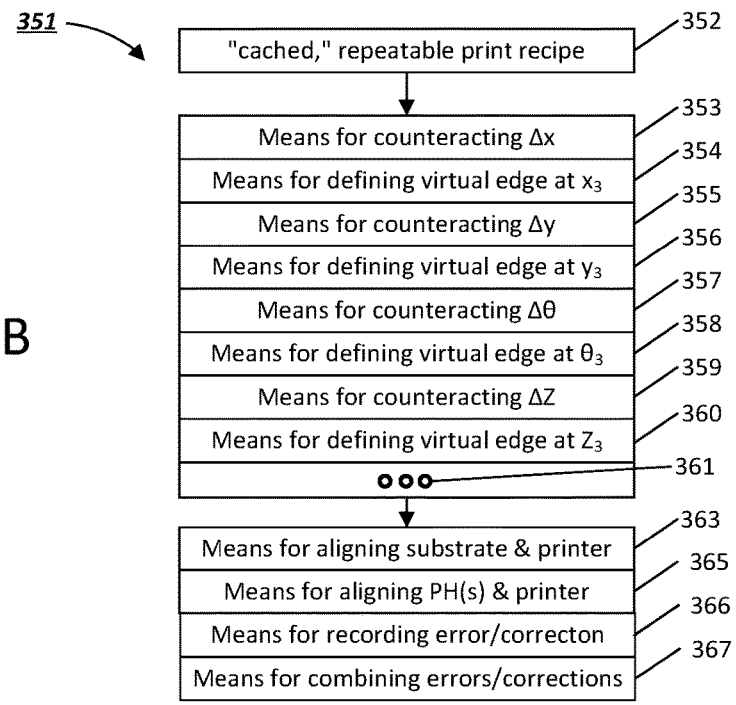
FIG. 3B is an illustrative diagram showing a mechanism for correcting for transport path error, for example, by performing compensating countermotions (or other error mitigation) in up to six different dimensions (e.g., potentially including three translational dimensions, as well as yaw, pitch and/or roll).

FIG. 3B indicates the techniques presented above can be embodied in many different forms to correct transport path error, as denoted generally by numeral 351. In the context of a printer for manufacturing applications, a print recipe can be stored or cached in advance in a manner that will be used to repeatably print, e.g., on many substrates on a successive basis as part of an assembly-line-style process, as indicated by numeral 352. As non-limiting examples, the techniques described herein can then be applied to correct for repeatable fine motion errors along paths corresponding to a motion of the substrate, motion of one or more printheads or printhead assemblies, motion of a camera assembly or inspection tool, and so forth. Other factors, such as temperature, printhead position, and so forth, can also be used. These techniques permit automated correction of motion along these transport paths for fine error, such that motion of the substrate (or optionally, any of these systems) is made to correspond to an ideal path, notwithstanding that the actual transport drive mechanism (e.g., motion of a gripper, edge guide, traveler, etc.) is still encumbered by path error which imparts unintended offsets, non-linearities and other errors. Generally speaking, correction is done by a subsystem independent of the print recipe, in a manner that permits print planning to assume that the substrate is ideally placed. For example, the structures described herein in one embodiment provide means for counteracting an error or unintended offset "$\Delta x$" in a first dimension relative to a transport path, where the first dimension is independent from the transport path (meaning it includes at least one component orthogonal thereto). Such means can comprise at least one transducer that is controlled as a function of transport path position to reduce or eliminate "$\Delta x$," as denoted by numeral 353 in FIG. 3B. Such means generally comprises transducers that are electronically controlled to effectuate positional displacement as a function of position along the transport path, and/or other factors. As represented by numeral 354, these structures (or a different, potentially overlapping set of structures) can provide means for defining a virtual edge at a specific, arbitrary position in the first dimension (e.g., at "$x_3$" in the embodiment from FIG. 2B) and offsetting a gripper component relative to the transport path (or a structure being transported) to such position; as before, such means also generally comprises transducers and associated hardware and/or instructional logic that causes the transducers to negate or equalize error. Per numeral 355, in another embodiment, the structures described herein provide means for counteracting an error "$\Delta y$" in a second dimension relative to the transport path; this second dimension is optionally independent from the transport path, but it can also (instead) represent a common dimension to the transport path or otherwise be generally synonymous with the transport path. Such means can comprise at least one transducer that is controlled as a function of transport path position (and/or other factors) to reduce or eliminate "$\Delta y$" such as, for example, by correcting position of a transported "thing" for the embodiment depicted above, or for otherwise adjusting velocity or motion along the transport path. In yet another variation, per numeral 356, the same structures that might be applied to counteract "$\Delta y$" can provide means for defining a virtual edge at a specific (absolute or relative) position in the second dimension (e.g., at a non-zero "$y_3$," relative to the embodiment above) and offsetting the transport path (or a structure being transported) to such position; such means also generally comprises transducers and logic to cause the transducers to effectuate positional displacement as a function of position along the transport path. In one embodiment, this means can encompass another transport path or associated error correction system, e.g., an error correction system associated with printhead transport (e.g., so as to compensate for nozzle firing times, substrate, printhead or other positional error, or other sources of error. In yet another embodiment (357), transducers similar to those discussed above can be applied to counteract rotational error ($\Delta\theta$); in one embodiment, this means can comprise a single transducer that converts electrical energy to structural rotation and, in other embodiments, two or more positional transducers can be applied to the same effect. For example, as discussed above, one implementation can use two voice coils, each a linear transducer, that when operated independently provide for rotational adjustment of the thing being transported, with a floating, mechanical pivot mechanism used to provide structural rigidity in support of the voice coils. These structures (or a different, potentially overlapping set of structures) can also provide means for defining (358) a virtual edge at a specific (absolute or relative) angular relationship relative to the first and second dimensions discussed above (e.g., at "$\theta_3$" in the embodiment above) and for offsetting the transport path (or a structure being transported) in a manner corresponding to such an orientation. In still another embodiment (359), structures described herein provide means for counteracting an offset "$\Delta z$" in a third dimension relative to a transport path, where the third dimension is optionally independent from the transport path, as well as the first and second dimensions referenced above. Such means once again can comprise at least one transducer that is controlled by hardware and/or software logic as a function of transport path position to reduce or eliminate error; transducers and supporting logic can also be used to define a virtual edge at $Z_3$ (360). Per numeral 361 and an associated set of ellipses, these techniques can be applied to a multitude of dimensions including correction of and/or offset in any of three positional dimensions and any of three rotational dimensions (i.e., yaw, pitch and/or roll). In some embodiments, as represented by numeral 363, means for correcting for misalignment can be applied to align a substrate to the printer's reference system; such means can include position sensor such as a camera, a handler or other transport device, a processor and associated support instructional and/or hardware logic. Per numeral 365, means for correcting error in and/or aligning a printhead (PH) can include transducers with support for a floating pivot point and/or common and differential correction modes, as referenced above. Per numeral 366, means for recording error (or correction control for the transducers) can comprise hardware and/or instructional logic and memory. A system can also include means (367) for combining error and/or correction signals, so as to correct for multiple sources of error (e.g., for multiple transport paths).

It should be noted that each of the referenced dimensional references, e.g., to the "x", "y", "$\theta$" or other dimensions is arbitrary, that is, these can refer to any dimension and are not limited to Cartesian or regular or rectilinear coordinates; in one embodiment, the "x" and "y" dimensions respectively correspond to the "cross-scan" and "in-scan" dimensions of a fabrication system, but this need not be the case for all embodiments.

By correcting for motion error in such a manner, the described processes provide for a "virtual" and/or ideal and/or straight transport path, notwithstanding that a mechanical motion system might still be encumbered, and might continue to track existent, repeatable flaws. Applied in the context of a manufacturing system, such as the aforementioned industrial printers, these techniques provide a powerful tool to enable precision positioning and manufacturing.

Figure 4A:
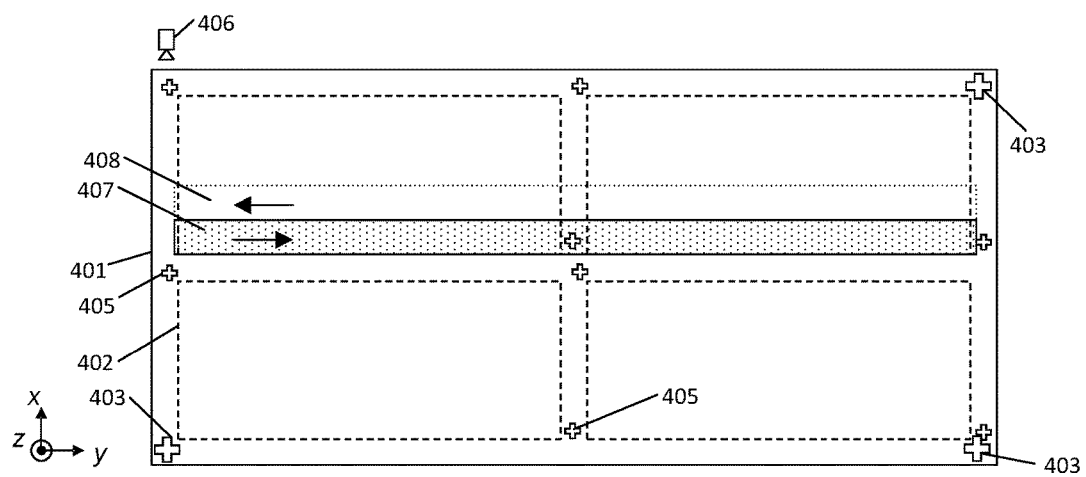
FIG. 4A provides a plan view of a substrate, and shows a raster or scanning process; a shaded area 407 represents a single scan path, while a clear area 408 represents another. As indicated by a dimensional legend in the FIG., in this example, an "x" axis corresponds to a cross-scan dimension while a "y" axis corresponds to an in-scan dimension.

FIG. 4A depicts a substrate 401, with a number of dashed-line boxes representing individual panel products. One such product, seen in the bottom left of the FIG., is designated using reference numeral 402. Each substrate (in a series of substrates) in one embodiment has a number of alignment marks, such as represented by numeral 403. In one embodiment, two such marks 403 are used for the substrate as a whole, enabling measurement of substrate positional offset relative to mechanical components of the printer (e.g., the gripper) and, in another embodiment, three or more such marks 403 are used to facilitate additional adjustments (e.g., rotational adjustment). In yet another embodiment, each panel (such as any of the four depicted panels) is accompanied by per-panel alignment marks, such as marks 405; this latter scheme permits gripper adjustment so that the individual panel being printed is precisely aligned to the printer's coordinate reference system. Whichever scheme is used, one or more cameras 406 are used to image the alignment marks in order to identify substrate position relative to the printer's coordinate reference system. In one contemplated embodiment, a single motionless camera is used, and the transport mechanism of the printer (e.g., a handler and/or air flotation mechanism) moves the substrate to position each alignment mark in sequence in the field of view of the single camera; in a different embodiment, the camera is mounted on a motion system (e.g., a printhead assembly as previously discussed) for transport relative to the substrate. The camera can be mounted to a common assembly of the printhead or a second assembly, to a common traveler used for printhead transport or to a completely independent traveler, depending on embodiment. In yet other embodiments, low and high magnification images are taken, the low magnification image to coarsely position a fiducial for high resolution magnification, and the high magnification image to identify precise fiducial position according to a printer coordinate system; a line or CCD scanner can also be used. Reflecting on the earlier discussion, in one embodiment, the transport mechanism(s) of the printer (and associated feedback/position detection mechanisms) control(s) motion to within about a micron of intended position, with the imaging system used per-substrate to align (and to optionally mechanically reposition) the substrate to the printer's coordinate reference system; prerecorded error or transducer correction signals can then be applied to correct for repeatable motion error in the manner described.

In a typical implementation, printing will be performed to deposit a given material layer on the entire substrate at once (i.e., with a single print process providing a layer for multiple products). Note that such a deposition can be performed within individual pixel wells (not illustrated in FIG. 4A, i.e., there would typically be millions of such wells for a television screen) to deposit light generating layers within such wells, or on a "blanket" basis to deposit a barrier or protective layer, such as an encapsulation layer. Whichever deposition process is at issue, FIG. 4A shows two illustrative scans 407 and 408 along the long axis of the substrate; in a split-axis printer, the substrate is typically moved back and forth (e.g., in the direction of the depicted arrows) with the printer advancing the printhead positionally (i.e., in the vertical direction relative to the drawing page) in between scans. Note that while the scan paths are depicted as linear, this is not required in any embodiment. Also, while the scan paths (e.g., 407 and 408) are illustrated as adjacent and mutually-exclusive in terms of covered area, this also is not required in any embodiment (e.g., the printhead(s) can be applied on a fractional basis relative to a print swath, as necessary or desired). Finally, also note that any given scan path typically passes over the entire printable length of the substrate to print a layer for multiple products in a single pass. Each pass uses nozzle firing decisions according to the print recipe, with control over the transducers (not shown in FIG. 4A) used to ensure that each droplet in each scan is deposited precisely where it should be relative to substrate and/or panel boundaries.

Figure 4B:
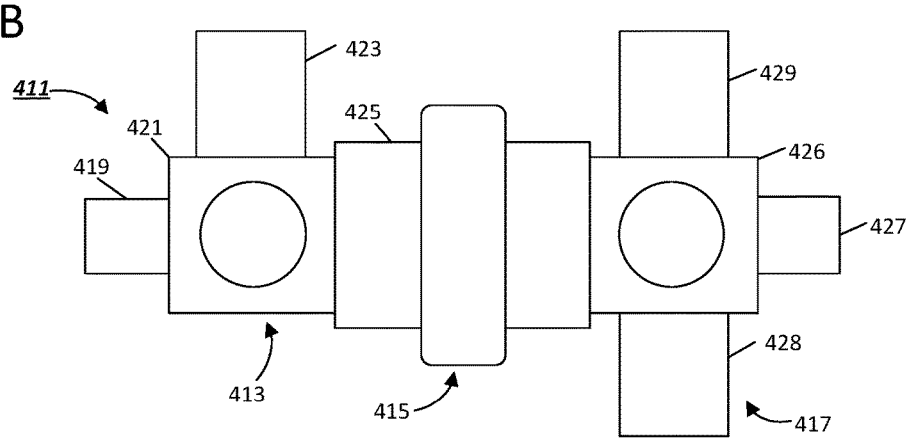
FIG. 4B provides a plan, schematic view of a fabrication machine that includes multiple modules, one of which (415) features a printer within a controlled atmosphere.

FIG. 4B shows one contemplated multi-chambered fabrication apparatus 411 that can be used to apply techniques disclosed herein. Generally speaking, the depicted apparatus 411 includes several general modules or subsystems including a transfer module 413, a printing module 415 and a processing module 417. Each module maintains a controlled environment, such that printing for example can be performed by the printing module 415 in a first controlled atmosphere and other processing, for example, another deposition process such an inorganic encapsulation layer deposition or a curing process (e.g., for printed materials), can be performed in a second controlled atmosphere; these atmospheres can be the same if desired. The apparatus 411 uses one or more mechanical handlers to move a substrate between modules without exposing the substrate to an uncontrolled atmosphere. Within any given module, it is possible to use other substrate handling systems and/or specific devices and control systems adapted to the processing to be performed for that module. Within the printing module 415, as discussed, mechanical handling can include use (within a controlled atmosphere) of a flotation table, gripper, and alignment/fine error correction mechanisms, as discussed above.

Various embodiments of the transfer module 413 can include an input loadlock 419 (i.e., a chamber that provides buffering between different environments while maintaining a controlled atmosphere), a transfer chamber 421 (also having a handler for transporting a substrate), and an atmospheric buffer chamber 423. Within the printing module 415, it is possible to use other substrate handling mechanisms such as a flotation table for stable support of a substrate during a printing process. Additionally, a xyz-motion system (such as a split-axis or gantry motion system) can be used to reposition and/or align the substrate to the printer, to provide for precise positioning of at least one printhead relative to the substrate, and to provide a y-axis conveyance system for the transport of the substrate through the printing module 415. It is also possible within the printing chamber to use multiple inks for printing, e.g., using respective printhead assemblies such that, for example, two different types of deposition processes can be performed within the printing module in a controlled atmosphere. The printing module 415 can comprise a gas enclosure 425 housing an inkjet printing system, with means for introducing a non-reactive atmosphere (e.g., nitrogen or a noble gas) and otherwise controlling the atmosphere for environmental regulation (e.g., temperature and pressure, gas constituency and particulate presence).

Various embodiments of a processing module 417 can include, for example, a transfer chamber 426; this transfer chamber also has a including a handler for transporting a substrate. In addition, the processing module can also include an output loadlock 427, a nitrogen stack buffer 428, and a curing chamber 429. In some applications, the curing chamber can be used to cure, bake or dry a monomer film into a uniform polymer film; for example, two specifically contemplated processes include a heating process and a UV radiation cure process.

In one application, the apparatus 411 is adapted for bulk production of liquid crystal display screens or OLED display screens, for example, the fabrication of an array of (e.g.) eight screens at once on a single large substrate. The apparatus 411 can support an assembly-line style process, such that a series of substrates is processed in succession, with one substrate being printed on and then advance for cure while a second substrate in the series is concurrently introduced into the printing module 415. The screens manufactured in one example can be used for televisions and as display screens for other forms of electronic devices. In a second application, the apparatus can be used for bulk production of solar panels in much the same manner.

The printing module 415 can advantageously be used in such applications to deposit organic light generating layers or encapsulation layers that help protect the sensitive elements of OLED display devices. For example, the depicted apparatus 411 can be loaded with a substrate and can be controlled to move the substrate between the various chambers in a manner uninterrupted by exposure to an uncontrolled atmosphere during the encapsulation process. The substrate can be loaded via the input loadlock 419. A handler positioned in the transfer module 413 can move the substrate from the input loadlock 419 to the printing module 415 and, following completion of a printing process, can move the substrate to the processing module 417 for cure. By repeated deposition of subsequent layers, each of controlled thickness, aggregate encapsulation can be built up to suit any desired application. Note once again that the techniques described above are not limited to encapsulation processes, and also that many different types of tools can be used. For example, the configuration of the apparatus 411 can be varied to place the various modules 413, 415 and 417 in different juxtaposition; also, additional, fewer or different modules can also be used. In one embodiment, the depicted apparatus 411 can be daisy-chained with other modules and/or systems, potentially to produce other layers of the desired product (e.g., via different processes). When a first substrate in a series is finished (e.g., has been processed to deposit material that will form the layer in-question), another substrate in the series of substrates is then introduced and processed in the same manner, e.g., according to the same recipe.

While FIG. 4B provides one example of a set of linked chambers or fabrication components, clearly many other possibilities exist. The techniques introduced above can be used with the device depicted in FIG. 4B, or indeed, to control a fabrication process performed by any other type of deposition equipment.

Once printing is finished, the substrate and wet ink (i.e., deposited liquid) can then be transported for curing or processing of the deposited liquid into a permanent layer. For example, returning briefly to the discussion of FIG. 4B, a substrate can have "ink" applied in a printing module 415, and then be transported to a curing chamber 429, all without breaking the controlled atmosphere (i.e., which is advantageously used to inhibit moisture, oxygen or particulate contamination). In a different embodiment, a UV scanner or other processing mechanism can be used in situ, for example, being used on split-axis traveler, in much the same manner as the aforementioned printhead/camera assembly.

Figure 4C:
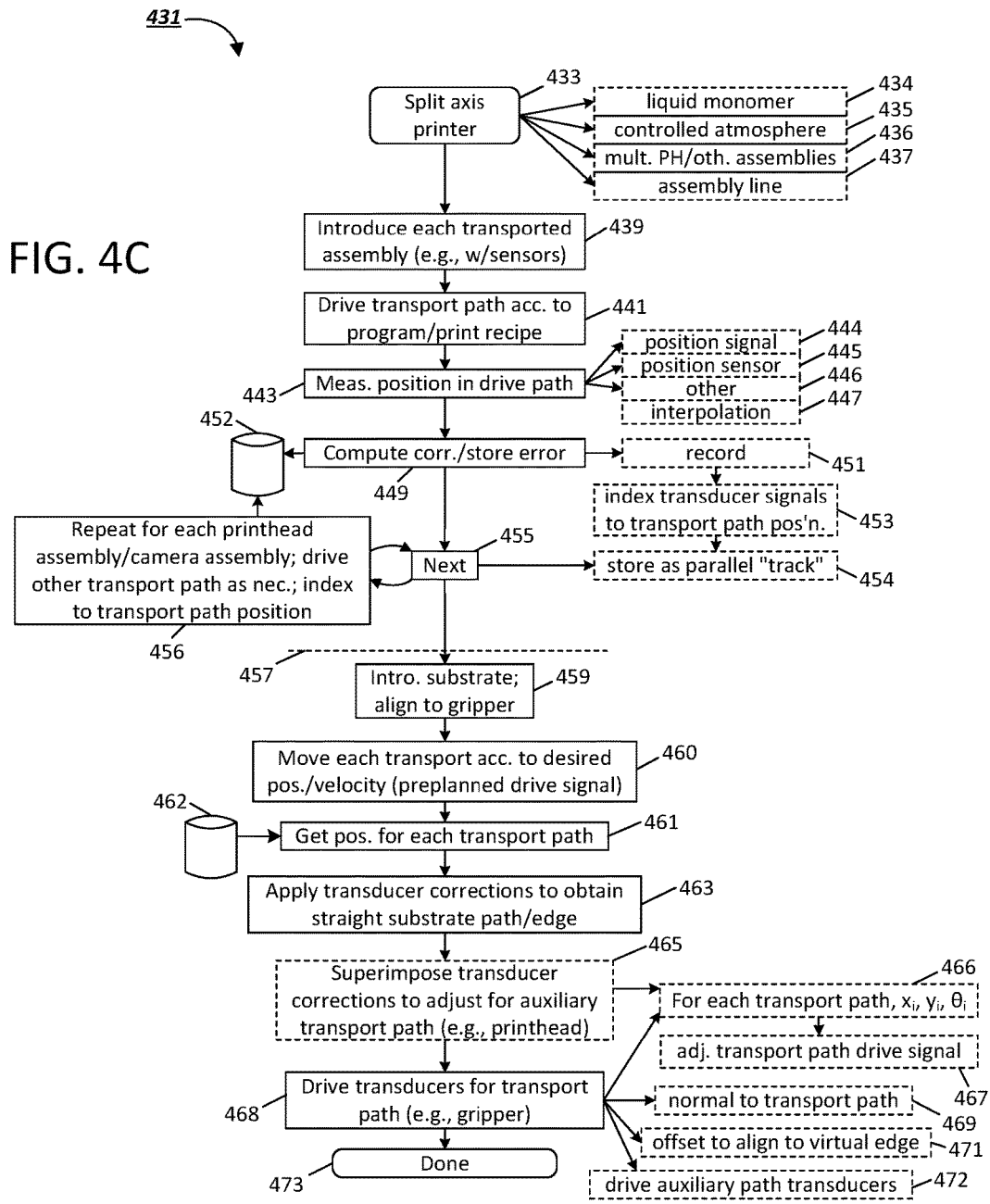
FIG. 4C is a block diagram that illustrates one method 431 of measuring, recording and then correcting for repeatable transport path error in an industrial printing system.

FIG. 4C illustrates process flow 431, this time rooted specifically in the context of a split-axis printer 433. Various process options are illustrated in option blocks 434-437, such as the use of a liquid monomer as the "ink," use of a printer enclosure which permits printing to occur in the presence a controlled atmosphere (for the purpose of minimizing presence of unwanted particulate and/or moisture with deposited ink), the use of multiple printhead, camera, UV or other assemblies, and the use of an "assembly-line" style process through which multiple substrates will be sequentially passed and subjected-to the same manufacturing process(es). Process blocks 439-456 refer to an offline calibration process that is used to premeasure repeatable error in the environment of such a printer. For example, for a transport path for which error is to be measured, the transported thing is introduced, optionally with appropriate sensors mounted on it to measure positional and/or rotational error, per numeral 439. This is not required for all implementations, e.g., in one system, a calibration process advances the gripper and incremental amount and then uses an optical detection system (e.g., predicated on a high resolution camera) to measure the exact position of substrate fiducials, with interpolation 447 being applied to derive error corresponding to any intermediate positions. In another contemplated embodiment, the gripper (e.g., the gripper's "second component") mounts an optical device (e.g., a mirror set) which diverts a laser beam, and one or more targets are used to continuously detect magnitude of "x error" "on the fly" as the gripper is advanced. Clearly, many options will occur to those having ordinary skill in the art.

Whichever error detection system is used, the particular transport path is then driven according to desired print process 441, with position of the thing being transported being measured (e.g., to register advancement along the transport path and associate that advancement with fine error with each advancement of a test substrate), 443. As indicated by option blocks at the right side of the figure, exemplary processes include the use of a position signal 444 (e.g., an analog or digital signal representing drive of the thing being transported), use of a position sensor 445, and/or the use of another mechanism 446 to derive position. Per numeral 449, for each position along the transport path in question, error and/or corrections are computed and used to generate a transducer control signal, which is recorded 451 stored in non-transitory storage 452, in a manner ideally indexed 453 to transport path position or advancement and/or other factors (or to positions for multiple transport paths, e.g., as a function of current gripper position and printhead assembly position). Maintaining previous examples, if a gripper is to be advanced according to a digital position signal, then transducer control signals to correct for error can be stored in a manner indexed by digital value of the digital position signal associated with the gripper, with a similar value optionally being registered as a function of each other transport path position and/or values of other factors of interest. For embodiments having multiple transducers, each independently driven as a function of path position, a control signal for each transducer optionally can be stored as a parallel track 454. As further indicated by numeral 455, transducer control signals optionally can also be computed in second or additional iterations for each independent transform mechanism (i.e., such that control signals are developed for each set of transducers, for example, a set of corrections for the gripper's error mitigation system and a set of corrections for the printhead assembly's error mitigation system). In situations where one error correction system is to correct for multiple transport paths, then an array of correction signals can be stored as a function of positions along all associated transport paths. In one embodiment, as noted earlier, where error mitigation is to be performed by a correction system for one conveyance path to cover error in multiple conveyance paths, correction signals may be superimposed (or otherwise developed as a function of a mathematical formula or equation) according to each relevant transport path position, for example, error $(i,j)=fn\{gripper:pos(i),printhead\ assembly:pos(j)\}$. Other examples will occur to those having skill in the art. As denoted by numeral 456, where correction is to be a function of multiple transport path positions, correction signal pre-computation can include repetition of motion/error measurement for each transport path position or for each combination of respective transport path positions, optionally treating each transport path position as an independent degree of freedom.

A dashed line 457 is used to demark offline calibration tasks (above the line) from run-time tasks (below the line).

During run-time, each new production substrate is introduced and aligned 459, e.g., to have a normalized relationship in each of x, y and θ dimensions. Each transport path (e.g., substrate, printhead, other) is then driven according to preprogrammed printing instructions, per numeral 460, i.e., in dependence on the recipe. The position of each transport path thing (e.g., substrate, printhead, etc.), per numeral 461 (and each other pertinent variable, as appropriate), is then used to directly index a memory 462 to retrieve error, a position value, a transducer drive value or some other value from which correction and/or desired position can be identified or computed. Any type of memory suitable for these purposes and for quick access can be used, for example, a hard drive, solid state storage, random access memory, flash memory, a content addressable memory, and so forth, as pertinent to the particular design. In another embodiment, as mentioned, a formula can be stored and provided to a processor or other circuitry for computation of error/offset at run-time. Transducer corrections are then output as a function of conveyance path positions to provide a virtual, perfect transport path or edge, per numeral 463; as part of this process, if the particular embodiment is to correct for multiple transport mechanisms or transport dimensions, each pertinent correction and/or transducer control value can at this point optionally be superimposed and/or otherwise combined to produce a correction for aggregate error 465 for multiple transport paths. Per numerals 466 and 467, in one optional design, the system corrects for yaw and translational error (e.g., "x," "y" and "θ") in each transport path while in another embodiment, a transport drive signal for one or more of the transport paths can be modified (e.g., to correct for imperfections that give rise to translational error in the primary dimension of transport). Transducers are then driven as appropriate 468 in order to equalize mechanical imperfections in one or more of the transport paths. As noted earlier, in one embodiment, the transducers can include linear transducers, which each offset a substrate in a direction normal to gripper path transport, per numeral 469; in another embodiment, offset can produce a "virtual edge" 471 and in yet another embodiment 472, the transducers can be used to offset an auxiliary path (e.g., a printhead path, gripper drive, and so forth). Printing is performed on the realigned substrate and the process ends 473, that is, until the next substrate is introduced. As should be apparent, these processes provide a repeatable process that can be used to process each substrate in a series.

Figure 4D:
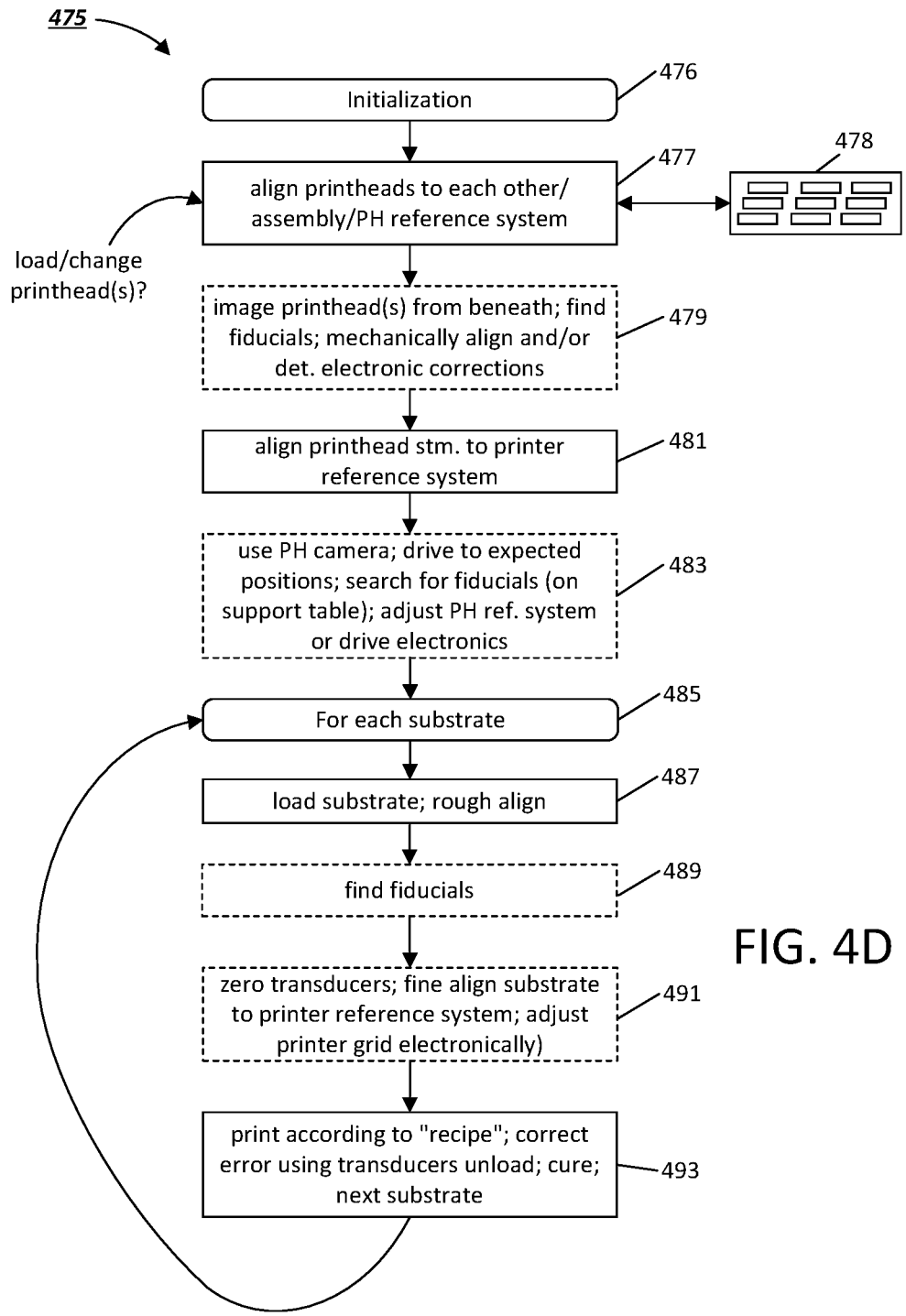
FIG. 4D illustrates a method where one or more printheads are aligned with the gripper during an initialization process, to thereby establish a coordinate reference system used by a printer (e.g., a coordinate system used for a printer support table); during production, as each new substrate in a series is introduced into the printer, that substrate is then also aligned to this same reference system as part of printing. Aligning each of the printhead(s) and each substrate to a common reference system permits the printhead(s) and the substrate to be properly aligned to each other at all times during printing.

FIG. 4D provides another flow chart relating to system operation, this time relating to system alignment, with a series of steps being generally designated using numeral 475. The method begins with system initialization, per numeral 476; for example, this initialization can be performed at each power-up, or on an ad-hoc (e.g., operator-commanded) or periodic basis. An alignment/detection operation 477 is thereafter performed for the various conveyance paths, for example, to identify an origin point or common frame of reference, as indicated earlier; as indicated at the left side of the FIG. this operation (or system initialization) can be performed if desired following a maintenance operation, for example, resulting in a change of the printheads or other system components. Note that numeral

478 represents a typical printhead assembly configuration, i.e., where the assembly mounts nine printheads (this may be one large assembly or a number of subassemblies, for example, three "ink-sticks" that each mount three printheads in a staggered configuration). In one embodiment, there can be 256-1024 nozzles per printhead. Optionally, as each printhead is changed, the calibration then continues per numeral 479 with a gripper system "upward facing" camera being used to image the underside of the printhead, to measure exact x,y position of each nozzle according to the printer's coordinate reference system, per numeral 481; that is, each printhead can feature one or more fiducials which are detected and then used to identify each nozzle using a search algorithm and image processing techniques. As necessary, the printhead position can be adjusted (e.g., interprinthead spacing adjusted) through the use of stepper motors or mechanical adjustment. Per numeral 483, and as referenced by the provisional patent application which was earlier incorporated by reference (No. 62/459,402), a camera system mounted by the printhead assembly can similarly be used to identify location of the gripper's "upward-facing" camera, so as to facilitate these various position detection functions.

As each substrate is introduced, 485, position of the substrate is precisely identified and used to align the substrate (and any products being fabricated thereon) to the printer's coordinate reference system. The new substrate is loaded 487, and is roughly aligned with the printer's transport systems (for example, edge aligned or otherwise using an initial transport process). A "downward-facing" camera system mounted by the printhead assembly is then employed, using a search algorithm and suitable image processing, to precisely find one or more substrate fiducials, 489; for example, this detection can be performed using a spiral or similar search pattern which searches about a fiducial expected position until precise fiducial position and/or orientation has been detected. A series of optional and/or alternative correction processes can then be employed so as to precisely position the substrate; for example, as indicated variously by process box 491, in one embodiment, the aforementioned transducers can be driven so as to provide precise substrate positioning (e.g., a vacuum lock of the gripper's "second component" is not adjusted, but the transducers are articulated in common- and/or differential-drive modes until the substrate fiducial has exactly the right start position and orientation. The transducer positions corresponding to this substrate position/orientation can then be used as a zero level or position, with error corrections (during production) then superimposed thereon. Alternatively or in addition, a mechanical handler can be used to reposition the substrate as necessary. As still another alternative, the recipe can be adjusted in software, as disclosed in US Patent Publication No. 20150298153, to correct for alignment error (e.g., with correction for repeatable error left for transducers associated with the gripper and/or printhead conveyance systems, as referenced earlier). Per numeral 493, printing then occurs; following printing, the just-printed substrate is unloaded for cure, while the system prepares to receive a new substrate under robotic- or human-direction.

Figure 5:
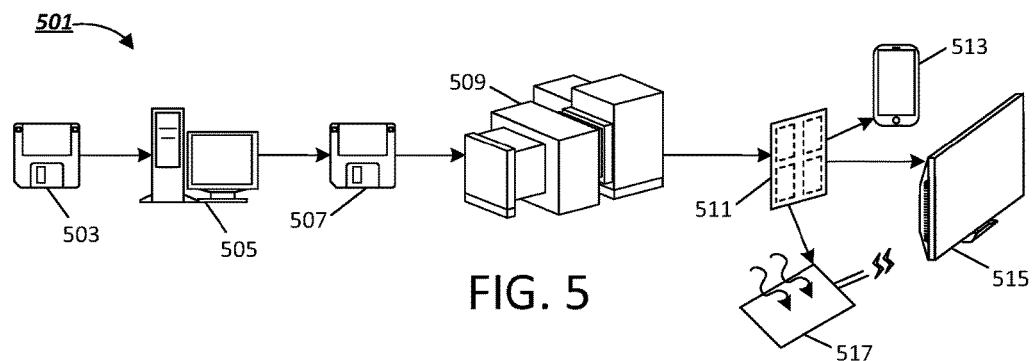
FIG. 5 is an illustrative view showing a series of optional tiers, products or services that can each independently embody techniques introduced herein; for example, these techniques can be embodied in the form of software (per numeral 503), or as printer control data (per numeral 507), to be used to control a printer to print on a substrate or otherwise to correct for repeatable error, or as a product made in reliance on these techniques (e.g., as exemplified by numeral 511, 513, 515 or 517).

FIG. 5 represents a number of different implementation tiers, collectively designated by reference numeral 501; each one of these tiers represents a possible discrete implementation of the techniques introduced herein. First, techniques as introduced in this disclosure can take the form of instructions stored on non-transitory machine-readable media, as represented by graphic 503 (e.g., executable instructions or software for controlling a computer or a printer). Second, per computer icon 505, these techniques can also optionally be implemented as part of a computer or network, for example, within a company that designs or manufactures components for sale or use in other products. Third, as exemplified using a storage media graphic 507, the techniques introduced earlier can take the form of a stored printer control instructions, e.g., as data that, when acted upon, will cause a printer to fabricate one or more layers of a component dependent on the use of different ink volumes or positions to mitigate alignment error, per the discussion above. Note that printer instructions can be directly transmitted to a printer, for example, over a LAN; in this context, the storage media graphic can represent (without limitation) RAM inside or accessible to a computer or printer, or a portable media such as a flash drive. Fourth, as represented by a fabrication device icon 509, the techniques introduced above can be implemented as part of a fabrication apparatus or machine, or in the form of a printer within such an apparatus or machine. It is noted that the particular depiction of the fabrication device 509 represents one exemplary printer device, for example, as discussed in connection with the FIG. 4B. The techniques introduced above can also be embodied as an assembly of manufactured components; in FIG. 5 for example, several such components are depicted in the form of an array 511 of semi-finished flat panel devices that will be separated and sold for incorporation into end consumer products. The depicted devices may have, for example, one or more light generating layers or encapsulation layers or other layers fabricated in dependence on the methods introduced above. The techniques introduced above can also be embodied in the form of end-consumer products as referenced, e.g., in the form of display screens for portable digital devices 513 (e.g., such as electronic pads or smart phones), as television display screens 515 (e.g., OLED TVs), solar panels 517, or other types of devices.

Having thus discussed in detail sources of positional error and associated remedies, this disclosure will now turn to discussion of a more detailed embodiment of a specific fabrication apparatus.

III. SPECIFIC IMPLEMENTATIONS

FIGS. 6A-6E are used to discuss specific printer implementations, namely, as applied to the manufacture of OLED display or solar panels. Depending on product design, the printer seen in these FIGS. can be used to deposit a layer for an array of products at-once on a substrate (e.g., many smart phone or other portable device displays, perhaps hundreds at a time, such as conceptually represented by the individual, arrayed products on substrate 411 from FIG. 4A), or a single product per substrate such as the display screen of the HDTV 415 or solar panel 417 from FIG. 4A. Many other example applications will be apparent to those having skill in the art.

Figure 6A:
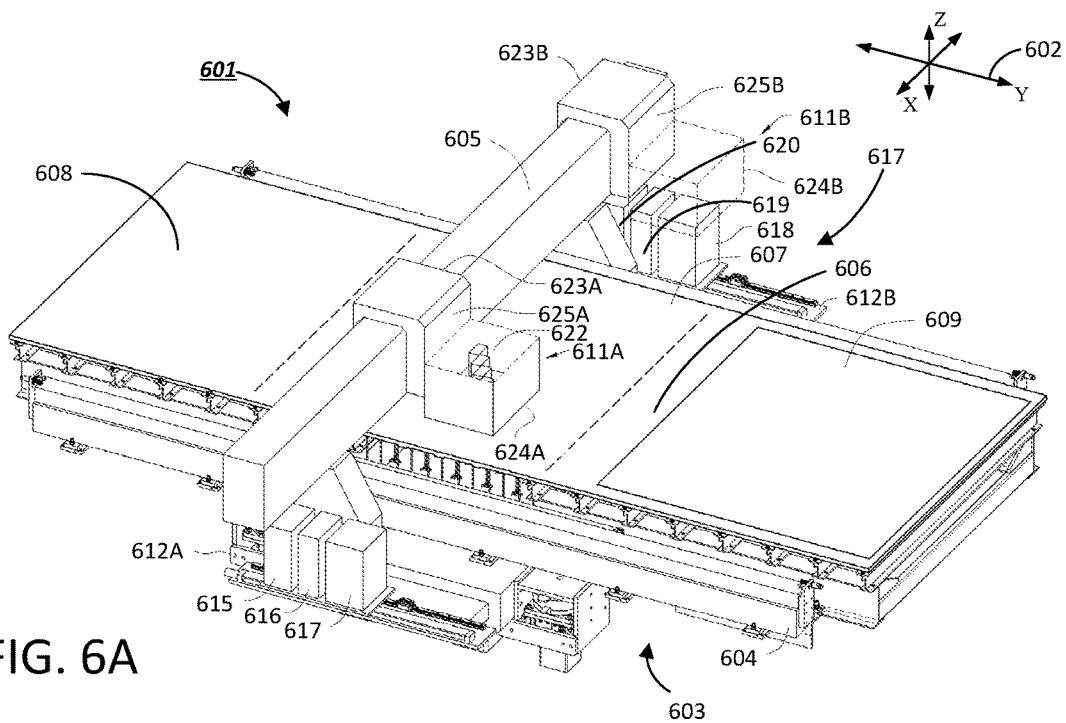
FIG. 6A is a detail, perspective view of one embodiment of an industrial printer, such as the printer inside the printing module of FIG. 4B.

More specifically, FIG. 6A shows a printer 601 as having a number of components which operate to allow the reliable placement of ink drops onto specific locations on a substrate. Printing in the illustrated system requires relative motion between each printhead assembly and the substrate. This can be accomplished with a motion system, typically a gantry or split-axis system. Either a printhead assembly can move over a stationary substrate (gantry style), or both the printhead assembly and substrate can move, in the case of a split-axis configuration. In another embodiment, a printhead assembly can be substantially stationary while the substrate is moved along both x- and y-axes relative to the printheads.

The printer comprises a printer support table 603 and a bridge 605; the printer support table 603 is used to transport substrates (such as substrate 609) using a planar flotation support surface mounted by a frame 604, while the bridge 605 is used for transport of a number of printheads and various support tools, for example, an optical inspection tool, cure device, and so forth. As noted earlier, a gripper (e.g., a vacuum gripper, not seen in this FIG.) provides a "fast axis" for conveying the substrate (e.g., in what is referred to elsewhere herein as the "y" dimension, see, e.g., dimensional legend 602), while the bridge permits one or more printhead assemblies 611A and 611B to move back and forth along the bridge 605 along a "slow axis." To effectuate printing, a printhead assembly (e.g., the primary assembly 611A) will be positioned at a suitable position along the bridge while the vacuum gripper moves the substrate in a generally linear manner along the "y" dimension, to provide for a first scan or raster; the printhead assembly 611A or 611B is then typically moved to a different position along the bridge 605 and stopped, with the vacuum griper then moving the substrate 609 back in the opposite direction underneath the new printhead assembly position, and so forth, to provide an ensuing scan or raster, and so forth.

The printer support table 603 can have a porous medium to provide for the planar floatation support surface. The planar flotation support surface includes an input zone, a print zone and an output zone, which are respectively designated using numerals 606-608; the substrate 609 is depicted in the input zone 606, ready to be printed on. A combination of positive gas pressure and vacuum can be applied through the arrangement of ports or using a distributed porous medium provided by the support table. Such a zone having both pressure and vacuum control can be effectively used to provide a fluidic spring between the flotation table surface and each substrate 609. A combination of positive pressure and vacuum control can provide a fluidic spring with bidirectional stiffness. The gap that exists between the substrate 609 and the surface of the flotation table can be referred to as the "fly height," with this height regulated by controlling the positive pressure and vacuum port states. In this manner, a z-axis height of the substrate can be carefully controlled at various parts of the printer support table, including without limitation, in the print zone 607. In some embodiments, mechanical retaining techniques, such as pins or a frame, can be used to restrict lateral translation of the substrate while the substrate is supported by the gas cushion. Such retaining techniques can include using spring loaded structures, such as to reduce the instantaneous forces incident the sides of the substrate while the substrate is being retained; this can be beneficial as a high force impact between a laterally translating substrate and a retaining means could potentially cause substrate chipping or catastrophic breakage. At other regions of the printer support table, the fly height need not be as precisely controlled, for example, in the input or output zones 606 and 608. A "transition zone" between regions can be provided such as where a ratio of pressure to vacuum nozzles increases or decreases gradually. In an illustrative example, there can be an essentially uniform height between a pressure-vacuum zone, a transition zone, and a pressure only zone, so that within tolerances the three zones can lie essentially in one plane. A fly height of a substrate over pressure-only zones elsewhere can be greater than the fly height of a substrate over a pressure-vacuum zone, such as in order to allow enough height so that a substrate will not collide with a printer support table in the pressure-only zones. In an illustrative example, an OLED panel substrate can have a fly height of between about 150 microns ($\mu$) to about 300$\mu$ above pressure-only zones, and then between about 30$\mu$ to about 50$\mu$ above a pressure-vacuum zone. In an illustrative example, one or more portions of the printer support table 603 or other fabrication apparatus can include an air bearing assembly provided by NewWay Air Bearings (Aston, Pa., United States of America). A porous medium can be obtained such as from Nano TEM Co., Ltd. (Niigata, Japan), such as having physical dimensions specified to occupy an entirety of the substrate 609, or specified regions of the substrate such as display regions or regions outside display regions. Such a porous medium can include a pore size specified to provide a desired pressurized gas flow over a specified area, while reducing or eliminating mura or other visible defect formation.

In the example of FIG. 6A, a handler or other conveyance system (not shown) delivers each substrate 609 to the input region 606 of the printer support table 603. The vacuum gripper engages the substrate 609, transports it from the input zone 606 into the print zone 607 and then moves the substrate back-and-forth for printing, to effectuate respective "near-frictionless," low-particle-generating, high-speed scans along the fast axis of the printer, according to the particular recipe. When printing is finished, the vacuum gripper then transports the substrate to the output zone 608, where a mechanical handler takes over and conveys the substrate to the next processing apparatus; during this time, a new substrate can be received in the input zone 606, and the vacuum gripper is then transported back to that zone to engage that new substrate. In one embodiment, deposited droplets of ink are allowed to meld together in the output zone, e.g., via a brief rest or settling period during which the substrate is allowed to remain in the output zone, with printing and settling and ensuing cure being performed within a controlled environment (e.g., generally in a nitrogen or noble gas atmosphere, or other non-reactive environment).

The depicted printer 601 also can include one or more maintenance or management bays 612A and 612B, each of which can store tools 615-620 for modular engagement by one or both printhead assemblies, for example, printheads, cameras, "ink sticks;" similarly, in one embodiment, these bays are configured for interaction with other components, such as a droplet measurement module, a purge basin module, a blotter module, and so forth, optionally within the same enclosed space (enclosure volume) or a second volume. In one embodiment, a printhead assembly can simultaneously mount three "ink sticks," as denoted by numeral 622, with each "ink stick" supporting three printheads and supporting fluidics and circuit contacts in a manner adapted for modular engagement with the printhead assembly. The ink delivery system (not separately shown in FIG. 6A) comprises one or more ink reservoirs, ink supply tubing to convey ink between the reservoirs and one or more of the printhead assemblies, and suitable control circuitry, while the motion system (also not separately shown in FIG. 6A) comprises electronic control elements, such as a subsystem master processor and control systems and actuating elements for the gripper and printhead assemblies, and suitable control code.

The printhead assemblies 611A/611B each comprise a traveler 623A/623B which rides along the bridge (i.e., on a track or guide) and an engagement mechanism 624A/624B mounted proximate to a front surface 625A/625B of the bridge to robotically engage and disengage each of the ink sticks or other tools on a modular basis as desired with each support bay 612A/612B. Each printhead assembly (611A/611B) is supported by a linear air bearing motion system (which is intrinsically low-particle generating) or other linear motion system to allow it to move along the bridge 605. Each printhead assembly is accompanied by fluidic and electronic connections to at least one printhead, with each printhead having hundreds to thousands of nozzles capable of ejecting ink at a controlled rate, velocity and size. To provide one illustrative example, a printhead assembly can include between about 1 to about 60 printhead devices, where each printhead device can have between about 1 to 90 printheads, with each printhead having 16 to about 2048 nozzles, each capable of expelling a droplet having of volume of about 1-to-20 picoLiters (pL) depending on design. The front surfaces 625A/625B each provide for a respective z-axis moving plate which controls height of the engagement mechanism (and thus printheads or other tools) above a surface of the substrate. The traveler and engagement mechanism can serve as the "first" and "second" components referenced earlier for the printhead assembly, e.g., these components in one embodiment are coupled by an electromechanical interface (not seen in FIG. 6A) which permits robotic adjustment of the transported tool in each of x, y and z dimensions. In this regard, U.S. Provisional Patent Application No. 62/459,402, referenced earlier, provides details relating to z-axis calibration of printheads and various other elements of the printer's coordinate reference system in general. The electromechanical interface can advantageously include stepper motors, fine adjustment screws and other mechanisms for adjusting (a) x, y and/or z mounting of each tool relative to the relevant engagement mechanism, and (b) pitch between respective tools (e.g., pitch between ink sticks). In addition, each tool can also include various fine adjustment mechanisms, e.g., for pitch adjustment between multiple printheads carried by each ink stick. The electromechanical interface can include a kinematic or similar mount for repeatably and reliably engaging each tool to within a micron of intended position in each dimension, with robotic adjustment mechanisms optionally configured to provide feedback for precise position adjustment of each tool relative to the engagement mechanism.

The electromechanical interface advantageously also includes a set of transducers as referenced earlier, e.g., to offset the engagement mechanism 624A/624B linearly in the "y" dimension relative to the associated traveler 623A/623B. As should be apparent from the discussion thus far, provision of a transducer correction mechanism to provide a "virtual straight edge" for the printhead(s) and provision of a transducer correction mechanism to provide another "virtual straight edge" for the gripper (not seen in FIG. 6A) facilitates a print grid which is more "regular," e.g., it helps ensure uniform droplet placement at precise, regular spacings associated with the print grid, thereby promoting enhanced layer uniformity.

As should be apparent, the depicted structural elements permit control over substrate x-axis position using common mode displacement of the substrate by the respective voice coil assemblies, as well as control over orientation of the substrate about the θ dimension (i.e., rotation about the z-axis). Various embodiments of the depicted gripper system can maintain the orientation of a substrate parallel to the y-axis of travel to within +/−4300 micro-radians, or less, depending on implementation. As mentioned earlier, when it is also desired to adjust substrate position to further match deviations in printhead (printhead assembly) position and orientation, this control over orientation together with common mode x-axis displacement, and the effective implementation of a floating pivot point for the substrate, permit precision repositioning of the substrate to simulate perfect, virtual edges (or guides) for each of substrate motion and traveler motion (e.g., printhead, camera, etc.). As noted earlier, each of the vacuum gripper and the printhead assembly/traveler also includes an optical system (not seen in the FIG.) for detecting alignment marks, i.e., to provide an electronic position signal that indicates with precision location of the gripper or printhead assembly along the associated transport path.

As should be observed, the use of voice coils in conjunction with air (gas) bearing support of a substrate, as well the vacuum based engagement between the gripper and substrate, provide an efficient mechanism for a frictionless, effective mechanism for both transporting and fine tuning position of a substrate. This structure helps maintain contact-minimized interaction with the substrate during electronic component fabrication (e.g., during layer deposition and/or cure), which helps avoid distortions and defects which could otherwise be engendered as a result of substrate deformation, localized substrate temperature fluctuation induced by contact, or other effects such as electrostatic energy buildup. At the same time, a near frictionless support and transducer system, in combination, help provide micron-scale or better throws used to perform fine tuning of substrate position. These structures help perform precise substrate corrections necessary to obtain one or more "virtual transport paths," notwithstanding mechanical imperfections as referenced earlier, and notwithstanding that a substrate that serves as the deposition target may be meters long and meters wide. The voice coils can also be configured to provide a relatively large maximum throw, for example, seven microns or more, which may be important depending on implementation (e.g., when a system at issue, given its manufacturing tolerances, experiences jitter of this magnitude).

Figure 6B:
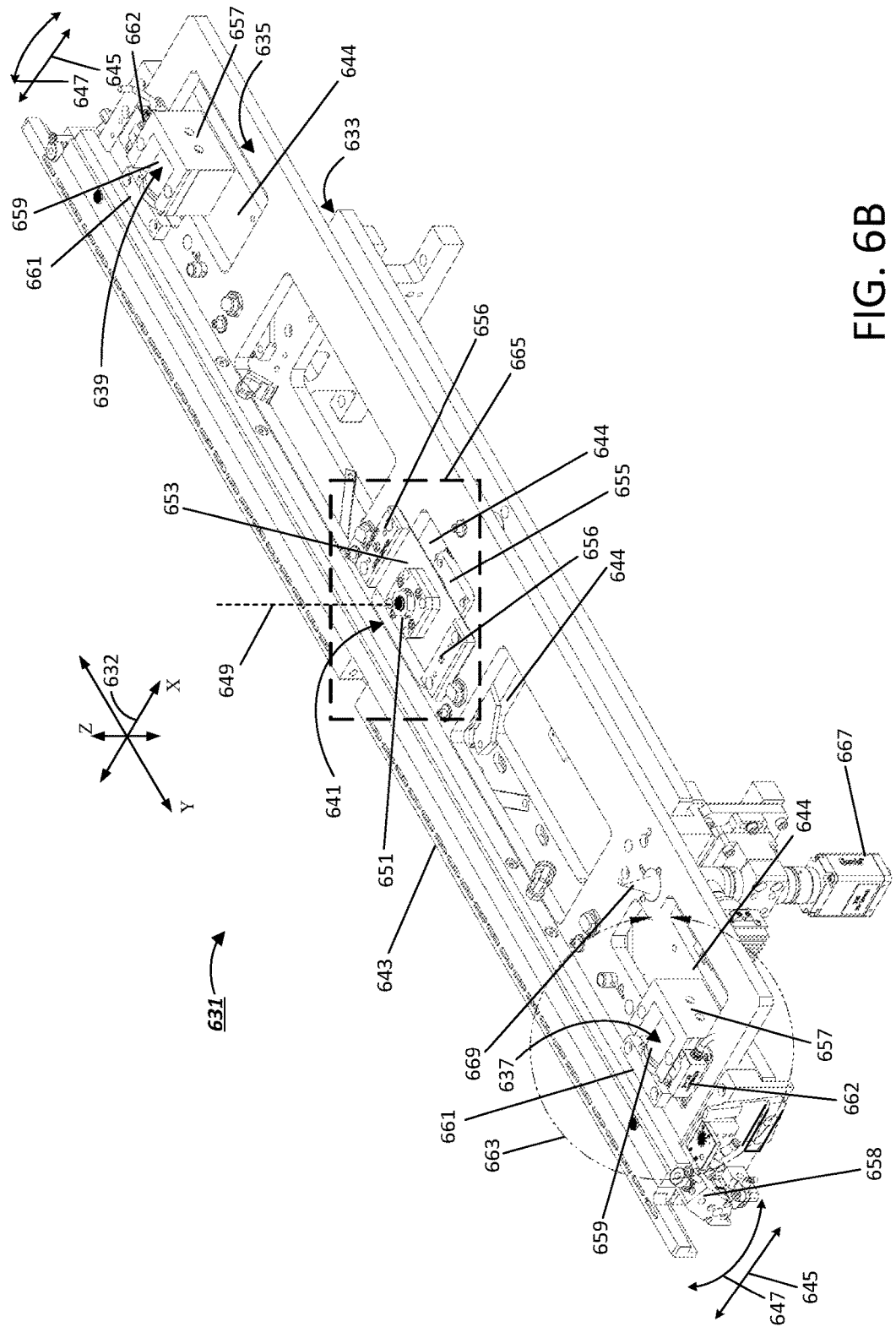
FIG. 6B is a detailed perspective view of an embodiment of a gripper.

FIG. 6B shows a vacuum gripper 631 in additional detail. The vacuum gripper 631 once again comprises a first component 633 (which rides atop a y-axis carriage, not seen in the FIG.), a second component 635 which engages substrates, and two linear transducers 637 and 639. Note that as depicted, the second component sits vertically above the first component as both are advanced along the gripper's direction of transport (e.g., along the "y-dimension" depicted by legend 632); the second component supports a vacuum chuck 643 that is used to selectively engage substrates. Unlike previous examples predicated on the use of a virtual pivot point, this example further includes a floating mechanical pivot assembly or mechanism 641 which provides a mechanical linkage between the first and second components 633/635 as the gripper is advanced along the y-dimension and helps provide structural support for embodiments where the linear transducers are embodied as voice coils. The floating pivot mechanism includes a pivot shaft 651, an assembly upper plate 653 (which is mounted to the gripper's second component 635) and an x-axis sliding lower plate 655 which moves on rails relative to a support frame 644 provided by the gripper's first component 633. The assembly upper plate preferably is made of a relatively thin material to provide flexure, for example, to permit leveling of the gripper's second component relative to the substrate and the floatation table, and is rigidly affixed to the second gripper's second component using mounting brackets 656. Succinctly stated, as component 633 is advanced along the y-dimension, the floating mechanical pivot mechanism 641 constrains the component 635 to also advance along the y-dimension while permitting x-axis sliding interaction between these components 633/635 and rotation about a floating pivot axis 649.

The floating pivot point permits differential- or common-mode drive of the transducers 637 and 639, as discussed previously; these various motions are further represented by sets of motion arrows 645/647. Generally speaking, each transducer couples a mounting block 657 (e.g., mounted relative to frame 644 of the gripper's first component) and a mounting plate 661 (mounted to the gripper's second component), with a linear actuator 659 coupling the mounting block and the mounting plate and providing precise displacement along the x-axis. Numeral 662 identifies a linear encoder, which generates a signal for each nanometer of displacement of the associated transducer, i.e., providing feedback to drive to a precise displacement value. As denoted by dashed-line outlines 663 and 665, the design of the transducers 637/639 and floating mechanical pivot mechanism 641 will be shown and discussed in greater detail in connection with FIGS. 6C and 6D.

Notably, FIG. 6B also shows a mechanical banker 658, which provides a "stop" for rough mechanical alignment of each introduced substrate, and an "upward-facing" camera 667, which (again) is used to image a fiducial via an optical path 669 (represented as a focal cone in the FIG.) for purposes of aligning the vacuum gripper and printhead assembly (not shown) to define the printer's coordinate reference system, and to identify relative distance and position of various printhead assembly components (e.g., precise printhead nozzle position and the printhead assembly camera, not shown in the FIG., in terms of the printer's coordinate reference system).

Figure 6C:
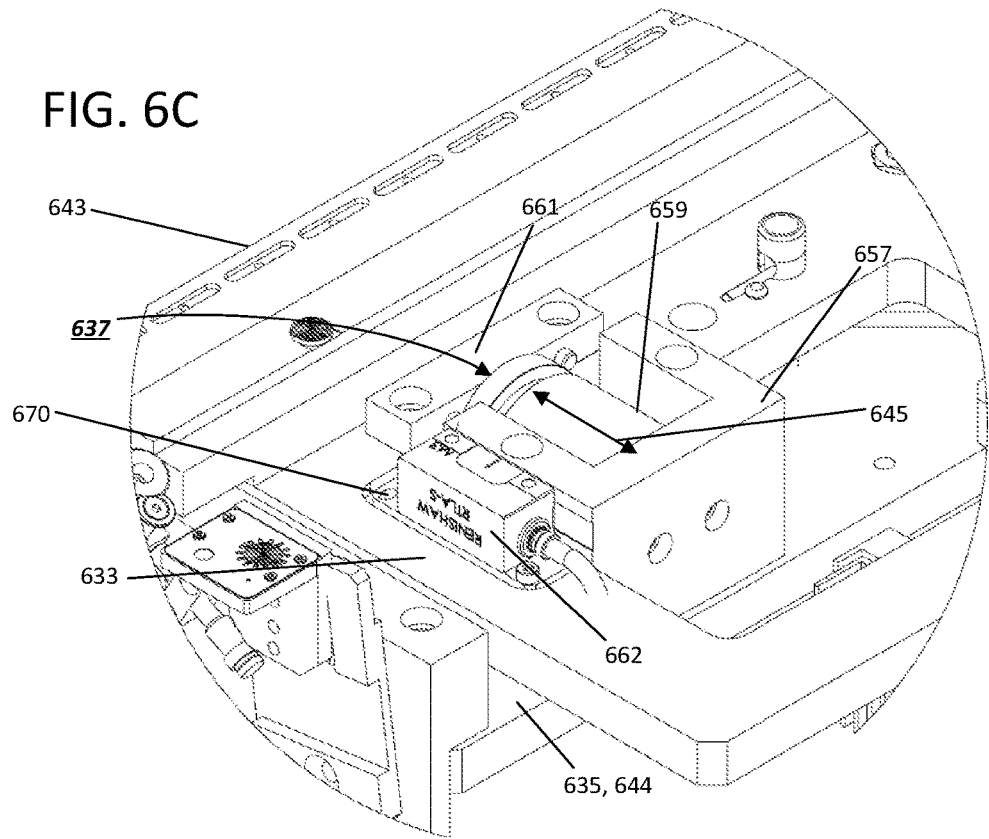
FIG. 6C is a close-up, perspective view of a transducer assembly from the gripper of FIG. 6B.

FIG. 6C shows an enlarged view of the linear transducer 637 from FIG. 6B. Once again, the other transducer (designated by numeral 639 in FIG. 6B) is generally identical or symmetrical in design to the transducer 637.

More particularly, the linear transducer in this example is predicated on a voice coil design with first and second components 633/635 of the gripper supported on an air bearing. The voice coil is contained within a cylindrical housing 659 to permit displacement of the second component (e.g., the vacuum chuck bar and substrate) relative to the second component along the general direction of double arrows 645. A adjustment plate 670 advantageously permits fine adjustments of transducer xyz orientation as between these two components, so as to linearly move the second components along the x-dimension axis (see dimensional legend 632 in FIG. 6B); once again, this can provided for with a configuration of manually adjustable screws that are adjusted and/or calibrated infrequently. The voice coil once again has a magnet-based design that provides for fast, accurate microscopic throws to displace the mounting plate 661 toward and away from the mounting block 657 as a function of an electronic control signal, i.e., once again, in the direction of double arrows 645.

Figure 6D:
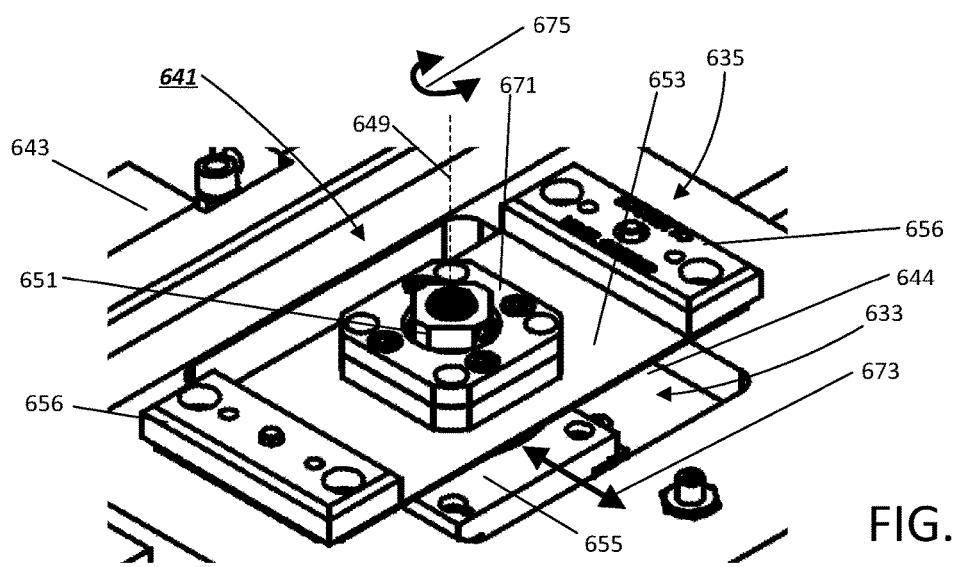
FIG. 6D is a close-up, perspective view of a floating, mechanical pivot assembly from the gripper of FIG. 6B.

FIG. 6D shows the floating, mechanical pivot mechanism 641 from FIG. 6B. As noted earlier, an assembly upper plate 653 carries a bushing which permits pivot of the assembly upper plate (and the gripper's second component and vacuum chuck) about a pivot axis 649. This axis is defined by a pivot shaft 651 which extends vertically downward parallel to the z-dimension, and which couples to the x-axis sliding lower plate 655. Although not seen in the FIG., the x-axis sliding lower plate 655 is coupled to the gripper's first component (via by support frame 644) by rails, so as to permit relatively frictionless x-axis displacement of the assembly upper plate 653, the pivot shaft 651, the vacuum chuck 643 and the gripper's second component 635 on a general basis relative to component 633 (and support frame 644), all while at the same time constraining these two components 633/635 to move together in the y-dimension. This structure provides mechanical support for a floating pivot point, with common-mode and differential-mode voice coil displacements being used, to respectively provide error-mitigating offsets of the second component along the direction of arrows 673 and rotation arrows 675. Note that a floating pivot point is not required for all embodiments, e.g., in embodiments where the transducer provides sufficient output impedance, a mechanical pivot mechanism can be potentially omitted. Whether a mechanical support structure is used or not, a floating pivot point advantageously permits common-mode and differential-mode control over multiple transducers, so as to reposition a substrate in x and θ dimensions, and so approximate a "straight edge" ideal transport path; various modifications and alternatives will no doubt occur to those of ordinary skill in the art.

Figure 6E:
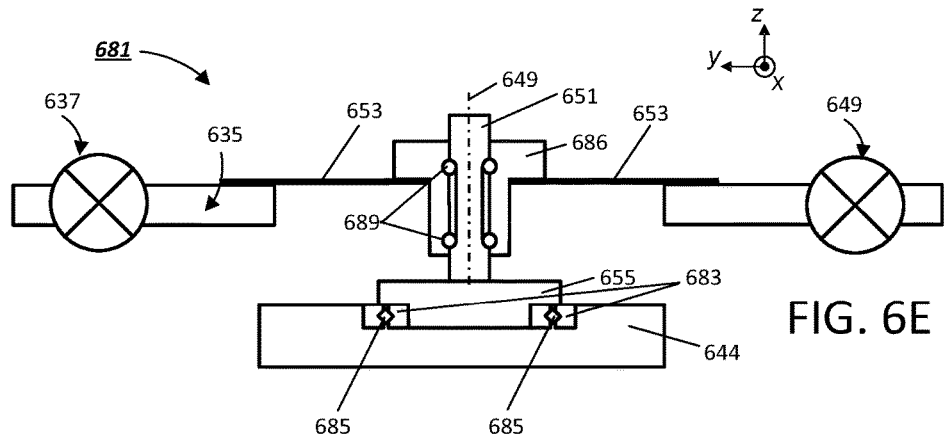
FIG. 6E is a schematic side view of the error correction system represented by FIGS. 6B-6D, with an emphasis on design of the floating, mechanical pivot assembly.

FIG. 6E provides a schematic view 681, which illustrates elements of the pivot mechanism represented by FIGS. 6B-6D. More specifically, this FIG. now illustrates a linear x-axis rails 683 which effectively provide a bearing 685 on either side of the x-axis sliding lower plate 655 to permit that structure (and everything supported above it) to ride into and out of the drawing page. At the same time, the assembly upper plate 653 mounts a bushing 686 so as to permit free rotation of that plate relative to the x-axis siding lower plate 655 about pivot axis 649. More specifically, the bushing 686 supports bearings 689 to permit this rotation. FIG. 6E also illustrates the flexure provided by the assembly upper plate 653, relative to the gripper's second component 635 and transducers 637/639.

While the transducer correction mechanisms depicted in FIGS. 6A-6D have been exemplified in the context of a gripper assembly, the same basic structure can also be used for the printhead assembly (or for each printhead assembly or other tool carrier). Specifically, a first component rides a track (or x-axis carriage assembly) atop a gas bearing, while a second component carrying printheads (or other tools) is displaced in a "y" and/or "z" dimension as a function of positional error in that dimension as a function of x-axis position (and/or other factors, e.g., temperature). For correction in a given dimension, two transducers are again used with a virtual or floating pivot point to effectuate both y and θ corrections (or z and xz-plane angular correction) in relative position of a printhead relative to a substrate, and in so doing, cause the printhead to follow a virtual straight edge path. Optionally using two such correction mechanisms together, to provide straight edge paths for each the gripper and printhead transport system, respectively, one may effectively provide for a very precise, regular print grid which provides for greater precision over droplet placement. Z-axis adjustment of the printhead can also be controlled using a transducer-based motion correction system of similar design, to provide for corrections in height of a printhead orifice plate relative to a substrate surface, and thereby manage height difference to also have improved precision. Other degrees of freedom may also be corrected in this manner. In a precision motion system, especially a printer based fabrication system, where a coordinate reference system used for printing/manufacture is effectively tied to multiple transport paths, the use of plural correction systems of this type improves precision over droplet landing location and thus facilitates greater uniformity in fabricated layers; in turn, this makes it easier to produce thinner layers, e.g., having thicknesses of five microns or less. It again bears noting that although the designs discussed above emphasize the use of a "virtual straight edge," for purposes of improving print grid regularity, all embodiments are not so limited, and nearly any desired "ideal" path can be approximated using the teachings provided here.

IV. ERROR MEASUREMENT

Note that in a system that corrects for repeatable motion error, it is generally desired to precisely measure error so as to ensure reliable operation. This can be performed for the gripper transport system, the printhead transport system and/or another transport system, as appropriate, using manual as well as automatic error measurement processes. A manual process is first described below, followed by a much less laborious automatic measurement process.

In a first technique, a high-resolution camera can be used to precisely identify position and/or orientation of the thing being transported in association with advancement along the transport path, optionally at each advancement point along the transport path, and optionally using a subset of those advancement points and interpolation to identify an error model for the transport path.

For example, as alluded to previously, in one embodiment, this calibration/error measurement can be performed for a gripper conveyance system by introducing a test substrate, aligning that substrate to the gripper (e.g., using the high-resolution imaging process as described earlier, and substrate fiducials), and advancing the substrate according to the desired print recipe; however, instead of printing per the corresponding print recipe, a high resolution camera is transported (incrementally between transport path advancements) in both x and y and used to find the specific position of one or more of the substrate's fiducials in terms of the printer's coordinate reference system; a search algorithm and image processing can be used to find precise position, which then permits processor derivation of deviation from expected coordinates. This error computation (and computation of mitigating transducer drive signals) can be performed by a calibration subsystem (i.e., that is separate from a gripper servo control subsystem, with errors/transducer mitigations then being transferred to the gripper servo control subsystem) or the calibration processes can be directly built in to the gripper servo control system. In another possible implementation, it is also possible to print on the entire substrate and to then use forensics (e.g., latent image processing) to identify jitter/corrections dependent on analyzing the printer droplet deposition pattern; image processing is used to identify droplet landing locations and/or parameters of a deposited wet or cured film, and to infer jitter and mitigating corrections from the identified locations/parameters. In yet another possible process, a CCD or line scanner can be used to continuously analyze recognizable features on the substrate during deposition and to infer jitter from translational and angular deviations in x and θ as the substrate is dynamically advanced. In much the same manner, a transported printhead can also be analyzed, for example, using an "upward" facing camera to periodically identify fiducials on a printhead assembly (possibly including individual nozzle positions), and to identify y and/or z position deviations of the printhead and changes in the levelness of each printhead orifice plate. For example, it is possible to have a separate camera system image the printhead(s) at different positions along the dimension of printhead transport in order to identify minor position and/or angular deviations.

Figure 7A:
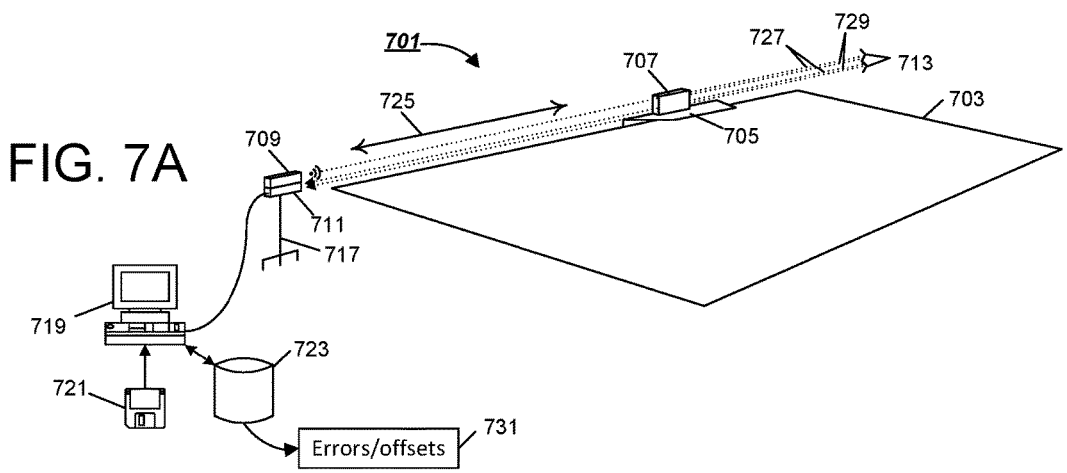
FIG. 7A is a perspective view of a substrate and transport system (e.g., for a gripper) used to measure error; a laser interferometry system directs light through optics 707 mounted to the gripper's displaceable or "second component" 705 or the thing being transported (e.g., substrate 705) with interferometric techniques being used to measure very slight (e.g., micron/milliradian scale or smaller) positional or angular deviations (including vibration).

FIG. 7A shows an automatic error measurement process, once again applied to the gripper conveyance system. It is once again noted that the same process can also be used to measure printhead position (e.g., by mounting interference optics to the printhead assembly as it is transported, and by detecting fine position and angular deviations of the printhead assembly along its path of advancement).

FIG. 7A provides an illustrative view, used to depict how substrate (or gripper) positional error is measured. A measurement system is generally represented by numeral 701, and relies on the use of laser interferometry to measure positional deviation in each of x and y dimensions (in this example), as well as substrate rotation (yaw, denoted elsewhere herein by the variable θ). More specifically, a test substrate 703 is held by a vacuum chuck 705 (e.g., carried by the gripper's "second component" as referenced earlier), which has interferometry optics 707 mounted to it. The substrate has alignment marks, as introduced above, and the gripper also has one or more alignment marks which are located and imaged by a camera or other imaging system during initial substrate introduction in order to precisely position the substrate relative to the vacuum chuck; in one embodiment, a mechanical handler or powered bankers are used to reposition the substrate until proper relative position is achieved, while in a second embodiment, the error compensation system introduced above (e.g., two or more transducers and floating pivot point) are used to reposition the substrate to have the proper orientation, with the corresponding transducer positions being adopted as the "zeroed" or initialized positions of the error correction system. The substrate and vacuum chuck are then moved along the gripper transport path, as represented by numeral 727, ideally just as would be performed as part of the desired print recipe. During this time, a laser 709 emits light of a specific wavelength, which travels through the gripper-mounted optics 707 and is directed along one or more paths 727 to mirrors/targets 713, and then bounced back via paths 729 back through the optics assembly and to a detector 711. The nature of the targets is such that if the substrate experiences jitter or deviation along the dimension being measured (e.g., translation or orientation variation), this produces a diffraction pattern that is sensed by the detector 711 and used to generate values, which are then fed to a computer 719 and used to compute precise error/position value as a function of position or advancement of the gripper. Note that the laser interferometry system (laser source 709, detector 711 and targets 713) are mounted in a manner fixed to a printer chassis 717, whereas it is movement of the optics 707 relative to the laser 709 and targets 713 that generates the interference pattern which is measured for error. Via a suitable configuration of the optics, any of x, y, θ, or other dimensional error can be measured dynamically as the substrate is advanced; note that other errors (e.g., z axis or other angular deviations) can also be measured depending on how the optics are configured and how many detectors and/or light sources are used. It is noted that laser interferometry measurement systems are today used in certain machine tools, and that it is within the level of one or ordinary skill in the art to configure the laser source and/or targets using known techniques to measure each dimension of interest; for example, a suitable interferometry system is the "XL-80" laser system available from Renishaw, PLC, which also publishes training materials on optics positioning and fine position measurement; it is within the level of ordinary skill to adapt these materials to measurement of substrate and/or gripper position. Following measurement, computation of error/compensation is then performed by the computer (i.e., by one or more processors acting under control of suitable software 721); as noted earlier, error and/or corrections 731 can be stored in non-transitory storage 723 (e.g., a lookup table), for subsequent reading out during production runs in a manner indexed by gripper position and/or other factors (e.g., such as temperature, specific recipe, specific panel and so forth).

Figure 7B:
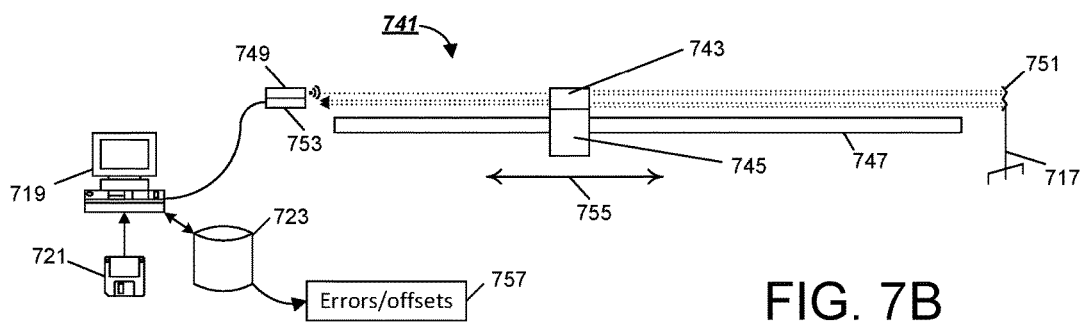
FIG. 7B provides a side view of a printhead (or camera) traveler assembly, i.e., a camera or printhead assembly 745 moves back and forth along traveler 747 with optics 743 mounted to the camera or printhead assembly to measure very slight positional or angular deviations affecting movement and orientation of assembly 745.

FIG. 7B is similar to FIG. 7A, but shows a configuration 741 for measuring fine mechanical imperfections that create error in a printhead position or camera position in a printing system. As before, a computer 719, software 721 and non-transitory storage 723 are used to measure error. In FIG. 7B, the printhead assembly (or other transported thing) is represented by numeral 745, with interferometry optics mounted to this assembly as denoted by numeral 743. The assembly moves back and forth as indicated by numeral 755 along a traveler 747, with a laser source 749, targets 751 and a detector 753 once again being used to measure positional deviation in along a dimension being measured. As before, the laser source 749, targets 751 and detector 753 are all precision mounted to a chassis 717 and do not move during measurement. As FIG. 7B illustrates, any mechanical transport path can be measured in this manner, and such a path can be independent of a substrate or other transport path (to which correction transducers are mounted). Once again, stored errors and/or correction values 757 can then be read out of non-transitory storage (e.g., a lookup table) as necessary during fabrication runs, indexed as necessary by printhead/camera position and/or other factors (e.g., such as temperature, specific recipe, specific panel and so forth).

As referenced earlier, it may be necessary to identify where the camera and/or printhead is relative to the gripper (not seen in FIG. 7B). As noted above, each transport system has one or more alignment marks, and so, the assembly 745 can be moved to a particular location (e.g., "position zero" at the left side of the traveler 747) concurrent with advancement of the gripper to its "position zero," with a search process and camera imaging being used to identify a coordinate system "origin" point as referenced earlier. Similarly a test substrate with alignment marks (and known geometry) can then be introduced in order to measure and interrelate coordinate systems pertinent to the gripper (and the flotation table), such that their positional relationship is precisely known. This type of processing is also advantageously performed by the computer and/or processor 719, acting under the control of suitable software 721.

Automated error measurement processes offer many advantages, including that a test run can be performed during a calibration process with errors and/or corrections being dynamically recorded during the continuous operation of each transport system. Recorded errors and/or corrections can then be played back as described. As necessary, error measurement processes can be reperformed, for example, at system startup, at milestone events (e.g., printhead change, when a predetermined error threshold is met, or at a periodic interval), or on demand (or operator command), in order to update or replace previously identified error and/or correction values.

V. CONCLUSION

Reflecting on the various techniques and considerations introduced above, a manufacturing process can be performed to mass produce products quickly and at low per-unit cost. Applied to display device or solar panel manufacture, e.g., flat panel displays, these techniques enable fast, per-panel printing processes, with multiple panels optionally produced from a common substrate. By providing for fast, repeatable printing techniques (e.g., using common inks and printheads from panel-to-panel), it is believed that printing can be substantially improved, for example, reducing per-layer printing time to a small fraction of the time that would be required without the techniques above, all while guaranteeing precision deposition of ink on a consistent basis within a desired target area of each substrate. Again returning to the example of large HD television displays, it is believed that each color component layer can be accurately and reliably printed for large substrates (e.g., generation 8.5 substrates, which are approximately 220 cm×250 cm) in one hundred and eighty seconds or less, or even ninety seconds or less, representing substantial process improvement. Improving the efficiency and quality of printing paves the way for significant reductions in cost of producing large HD television displays, and thus lower end-consumer cost. As noted earlier, while display manufacture (and OLED manufacture in particular) is one application of the techniques introduced herein, these techniques can be applied to a wide variety of processes, computer, printers, software, manufacturing equipment and end-devices, and are not limited to display panels. In particular, it is anticipated that the disclosed techniques can be applied to any process where a printer is used to deposit a layer of multiple products as part of a common print operation, including without limitation, to many microelectronics applications.

Note that the described techniques provide for a large number of options. In one embodiment, panel (or per-product) misalignment or distortion can be adjusted for on a product-by-product basis within a single array or on a single substrate. A printer scan path can be planned without need for adjustment/adaptation based on one or more alignment errors, such that misorientation of a substrate (or other transported item, such as a printhead) is automatically compensated for via transducers which couple a substrate and conveyance system (e.g., a gripper). In one embodiment, transducer correction can be used to mitigate error in a different transport path (e.g., a printhead transport path). Optionally, such corrections can be based on pre-measured error that is expected to repeat from substrate to substrate (or panel to panel).

Also, while various embodiments have illustrate the use of a gripper (or mechanism to couple the substrate to a conveyance mechanism), and the use of two transducers to effectuate fine tuning, other embodiments can use different numbers of these elements. For example, in one embodiment, two or more grippers can be used, each having their own, dedicated transducers. Alternatively, it is possible to use more than two transducers, and/or transducers for more than two axes of correction. In addition, while the techniques described above have been exemplified as applied to a printer that uses a vacuum gripper system, many other applications can benefit from the described techniques including applications that use a different type of conveyance mechanism, a different type or printer, a different type of deposition mechanism, or another type of transport path or mechanism. Clearly, many variations exist without departing from the inventive principles described herein.

The foregoing description and in the accompanying drawings, specific terminology and drawing symbols have been set forth to provide a thorough understanding of the disclosed embodiments. In some instances, the terminology and symbols may imply specific details that are not required to practice those embodiments. The terms "exemplary" and "embodiment" are used to express an example, not a preference or requirement.

As indicated, various modifications and changes may be made to the embodiments presented herein without departing from the broader spirit and scope of the disclosure. For example, features or aspects of any of the embodiments may be applied, at least where practical, in combination with any other of the embodiments or in place of counterpart features or aspects thereof. Thus, for example, not all features are shown in each and every drawing and, for example, a feature or technique shown in accordance with the embodiment of one drawing should be assumed to be optionally employable as an element of, or in combination of, features of any other drawing or embodiment, even if not specifically called out in the specification. Accordingly, the specification and drawings are to be regarded in an illustrative rather than a restrictive sense.

We claim:

1. A transport system for use with an electronic product manufacturing apparatus having a deposition source to deposit a material on a substrate and having a flotation table to support the substrate on a fluidic cushion while the material is being deposited thereon, the transport system comprising:
 a first component to travel along a track according to electronic stimuli, the track extending in a first direction;
 a second component conveyed by the first component, the second component to selectively engage the substrate so as to transport the substrate in the first direction;
 at least one transducer coupling the first component and the second component, the at least one transducer to displace the second component and the substrate in a direction orthogonal to the first direction;
 wherein the at least one transducer is to be driven so as to cause the substrate to travel along a straight line, notwithstanding that the track deviates from the straight line.

2. The transport system of claim 1, wherein the second component comprises a vacuum chuck that is to selectively engage the substrate using suction.

3. The transport system of claim 1, wherein the transport system further comprises a memory to store predetermined data, wherein the at least one transducer is to be driven according to the predetermined data to perform predetermined displacements of the second component and the substrate in the direction orthogonal to the first direction, in dependence on the electronic stimuli.

4. The transport system of claim 1, wherein the transport system further comprises a memory to store predetermined data, wherein the at least one transducer is to be driven according to the predetermined data to perform predetermined displacements of the second component and the substrate in the direction orthogonal to the first direction, in dependence on a position of the first component along the track.

5. The transport system of claim 1, wherein each transducer of the at least one transducer comprises one of a voice coil, a linear motor or a piezoelectric transducer.

6. The transport system of claim 1, wherein the at least one transducer comprises at least two transducers that are actuated using common-mode control, wherein the at least two transducers are driven together so as to displace the second component and the substrate in the direction orthogonal to the first direction, and differential-mode control, wherein the at least two transducers are differentially driven so as to rotate the substrate relative to the first direction.

7. The transport system of claim 6, wherein each transducer of the at least one transducer comprises a voice coil, wherein the transport system further comprises a mechanical pivot that couples the first component and the second component, the mechanical pivot defining a pivot point, and wherein:
 actuation of the at least two transducers using the common-mode control is effective to displace the mechanical pivot in the direction orthogonal to the first direction; and
 actuation of the at least two transducers using the differential-mode control is effective to rotate the second component and the substrate relative to the first component about the pivot point.

8. The transport system of claim 1, wherein the transport system further comprises a mechanical pivot that couples the first component and the second component, the mechanical pivot to permit the substrate to rotate relative to the first direction while constraining the substrate to travel with the first component along the first direction.

9. The transport system of claim 1, wherein the transport system is to transport the substrate within a plane of conveyance while the material is being deposited thereon, and wherein the direction orthogonal to the first direction is parallel to the plane of conveyance.

10. The transport system of claim 1, wherein the transport system is to transport the substrate within a plane of conveyance while the material is being deposited thereon, and wherein the direction orthogonal to the first direction is normal to the plane of conveyance.

11. The transport system of claim 10, wherein the at least one transducer is to displace the substrate toward and away from the deposition source.

\* \* \* \* \*